(12) United States Patent
Van Zyl

(10) Patent No.: US 10,623,012 B2
(45) Date of Patent: Apr. 14, 2020

(54) PRECISION DIGITAL TO ANALOG CONVERSION IN THE PRESENCE OF VARIABLE AND UNCERTAIN FRACTIONAL BIT CONTRIBUTIONS

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 16/409,476

(22) Filed: May 10, 2019

(65) Prior Publication Data

US 2019/0348992 A1 Nov. 14, 2019

Related U.S. Application Data

(60) Provisional application No. 62/669,454, filed on May 10, 2018.

(51) Int. Cl.
| | |
|---|---|
| *H03M 1/46* | (2006.01) |
| *G06F 17/18* | (2006.01) |
| *H03M 1/72* | (2006.01) |
| *H03H 19/00* | (2006.01) |
| *H03H 21/00* | (2006.01) |
| *H03H 7/38* | (2006.01) |

(52) U.S. Cl.
CPC ............ *H03M 1/466* (2013.01); *G06F 17/18* (2013.01); *H03H 7/38* (2013.01); *H03H 19/004* (2013.01); *H03H 21/0007* (2013.01); *H03M 1/462* (2013.01); *H03M 1/72* (2013.01)

(58) Field of Classification Search
None
See application file for complete search history.

(56) References Cited

U.S. PATENT DOCUMENTS

| | | | |
|---|---|---|---|
| 3,569,777 A | 3/1971 | Beaudry | |
| 5,195,045 A | 3/1993 | Keane | |
| 5,719,576 A * | 2/1998 | Draxelmayr | ........ H03M 1/0863 341/118 |

(Continued)

OTHER PUBLICATIONS

Prasai, Prakash, "International Search Report and Written Opinion Regarding Internation Application No. PCT/US2019/031827", dated Aug. 5, 2019, p. 10 Published in: AU.

*Primary Examiner* — Howard Williams
(74) *Attorney, Agent, or Firm* — Neugeboren O'Dowd PC

(57) ABSTRACT

This disclosure describes systems, methods, and apparatus for a digital-to-analog (DAC) converter, that can be part of a variable capacitor and/or a match network. The DAC can include a digital input, an analog output, N contributors (e.g., switched capacitors), and an interconnect topology connecting the N contributors, generating a sum of their contributions (e.g., sum of capacitances), and providing the sum to the analog output. The N contributors can form a sub-binary sequence when their contributions to the sum are ordered by average contribution. Also, the gap size between a maximum contribution of one contributor, and a minimum contribution of a subsequent contributor, is less than D, where D is less than or equal to two time a maximum contribution of the first or smallest of the N contributors.

18 Claims, 20 Drawing Sheets

(56) References Cited

U.S. PATENT DOCUMENTS

| | | | |
|---|---|---|---|
| 5,905,398 A * | 5/1999 | Todsen | H03K 17/693 327/337 |
| 6,043,058 A | 3/2000 | Ohyama et al. | |
| 6,181,218 B1 * | 1/2001 | Clark | H03B 5/32 331/177 R |
| 6,198,619 B1 | 3/2001 | Fujioka | |
| 6,356,135 B1 | 3/2002 | Rastegar | |
| 6,433,658 B1 | 8/2002 | Rastegar | |
| 6,441,671 B1 | 8/2002 | Rastegar | |
| 9,197,188 B2 | 11/2015 | Raieszadeh et al. | |
| 10,033,353 B2 * | 7/2018 | De Jongh | H03H 11/04 |
| 2013/0223040 A1 | 8/2013 | Li | |
| 2017/0178865 A1 | 6/2017 | Ulrich | |
| 2018/0076788 A1 | 3/2018 | Decker et al. | |

\* cited by examiner

PRECISION DIGITAL TO ANALOG CONVERSION IN THE PRESENCE OF VARIABLE AND UNCERTAIN FRACTIONAL BIT CONTRIBUTIONS

CLAIM OF PRIORITY UNDER 35 U.S.C. § 119

The present application for patent claims priority to Provisional Application No. 62/669,454 entitled "PRECISION DIGITAL TO ANALOG CONVERSION IN THE PRESENCE OF VARIABLE AND UNCERTAIN FRACTIONAL BIT CONTRIBUTIONS" filed May 10, 2018, and assigned to the assignee hereof and hereby expressly incorporated by reference herein.

FIELD OF THE INVENTION

The present invention relates generally to plasma processing. In particular, but not by way of limitation, the present invention relates to systems, methods and apparatuses for impedance-matching radio frequency power transmitted from a radio frequency generator to a plasma load in a semiconductor processing chamber.

DESCRIPTION OF RELATED ART

In the semiconductor manufacturing world, manufacturers produce plasma processing chambers that utilize radio frequency (RF) power to generate a plasma. In order to achieve efficient power transfer between the RF generator ("generator") and the plasma load, an impedance-matching network ("match network") is often used to match the load impedance to a desired input impedance, typically 50Ω. Plasma load impedance may vary depending on variables such as generator frequency, power, chamber pressure, gas composition, and plasma ignition. The match network accounts for these variations in load impedance by varying electrical elements, possibly including solid state variable capacitors, internal to the match to maintain the desired input impedance.

As a preliminary note, this disclosure will often discuss the "contribution" of capacitors that are switched in and out of circuits. One should note that the contribution of a capacitor to the overall capacitance of a circuit is not the same value as the capacitance of the capacitor. For instance, a 5 pF capacitor may not contribute 5 pF when switched into a circuit (on state) and 0 pF when switched out of a circuit (off state). Instead, the "contribution" of a capacitor also accounts for capacitance of the switch used to switch the capacitor in and out of the circuit. Given a switch with 6 pF capacitance in the off state in series with the above-noted 5 pF capacitor, the combination has a 5 pF capacitance when the switch is on and approximately 2.73 pF when the switch is off $$\left(\text{e.g., } \frac{1}{\frac{1}{5 \text{ pF}} + \frac{1}{6 \text{ pF}}}\right).$$

Thus, this 5 pF capacitor contributes a 2.27 pF $$\left(\text{e.g., } 5 \text{ pF} - \frac{1}{\frac{1}{5 \text{ pF}} + \frac{1}{6 \text{ pF}}} = 2.27 \text{ pF}\right)$$

difference in capacitance between its off and on states (or contribution), and thus is said to contribute a 2.27 pF value or to have a 2.27 pF value. This disclosure will often refer to this as a capacitor's "contribution," which is actually the change in capacitance of the capacitor and switch combination, in the on and off states, rather than an actual capacitance of the capacitor in isolation.

FIG. 1 illustrates a typical generator, match network, and plasma load system. The generator 102 transmits RF power to the match network 104 via a transmission line 108 (e.g., coaxial cable) and then onto the plasma load 106 via an electrical connection 110. The match network 104 varies its internal electrical elements (e.g., variable capacitors) such that the input impedance of the match network 104 is close to the desired input impedance. Match networks typically contain reactance elements, meaning elements that store energy in electrical and magnetic fields as opposed to resistive elements that dissipate electrical power. The most common reactance elements are capacitors, inductors and coupled inductors but others such as distributed circuits are also used.

Some match networks include two or more variable reactance elements, such as the variable capacitors 202 and 204 shown in FIG. 2. Variable capacitors can each include a plurality of switched capacitors. A variable capacitor can include a plurality of fractional and full-valued capacitors switched in and out of each of the variable capacitors 202 and 204. In general, the switched capacitors are switched into a respective variable capacitor 202 or 204 in such a way that the switched capacitors are all in parallel when all the switches are on. The value of the full-valued capacitors is dictated by the maximum current that either the switch or capacitor can handle. E.g. if the maximum voltage over the variable capacitor is 1000 V, the operating frequency is 13.56 MHz and the switch can handle 4 A, the maximum value that the full valued capacitors can be is 47 pF. If e.g. the switch has an off state capacitance of 8.2 pF, the switch and capacitor combination (e.g., see $C_N$ and $SW_N$ in FIG. 3A) add 47 pF to the total capacitance of the variable capacitor when the switch is on and 7 pF when the switch is off. Such a capacitor and switch pair adds 7 pF to the base of value of the variable capacitor and a 40 pF change in capacitance, which is the "value" or "contribution" associated with the capacitor and switch combination, when the state of the switch is changed. The amount of capacitance achieved as these switched capacitors are switched in and out of the variable capacitor can be mapped to a "capacitor setting," which can vary from 0 to a convenient number, such as 2047. Other mappings, such as from 1.1 to 2.3, is also possible, but mapping from 0 to $2^n-1$, with n being an integer, is generally convenient for implementation in digital hardware and software. When none of the fractional and full-valued capacitors are switched into the variable capacitor, the variable capacitor has a finite but minimum capacitance, corresponding to the lowest capacitor setting value, which is 0 in this example. When all of the fractional and full-valued capacitors are switched into the variable capacitor, the variable capacitor can have a maximum capacitance, corresponding to the highest capacitor setting value, which is 2047 in this example. By switching combinations of the fractional and full-valued capacitors into the variable capacitor, capacitances between this minimum and maximum can be achieved, thereby varying the capacitance of the variable capacitor.

While two variable capacitors 202 and 204 are shown in FIG. 2, in other embodiments, one variable capacitor or more than two variable capacitors can be used. One or more inductors may also be arranged before or between the variable capacitors, where the illustrated configuration is just one of many implementations. A variable reactance section 206, including the variable capacitors 202, 204 can be arranged with fixed reactance sections 208 and 210, for instance, comprising, for instance a capacitor and inductors, though other embodiments of the fixed reactance sections 208 and 210 can also be implemented. Together, the fixed and variable reactance sections 208, 210, and 206 can make up the match network.

To put this another way, solid state matches using switched capacitors to create a variable capacitor convert a digital capacitor setting to an analog capacitor value. The conversion is a form of digital to analog conversion where fractional (meaning less than full valued) and full-valued capacitors are added together to set the variable capacitor value. For instance, fractional capacitors that add capacitances of 5 pF, 10 pF and 20 pF together with 5 full-valued capacitors that add 40 pF each to a base value of 50 pF can theoretically create an effective variable capacitor that varies from 50 pF (the base value) to 285 pF (50+5*40+5+10+20=285). Each of these "contributors" or "values" represents a change in the capacitance of the variable capacitor when a given one or more capacitors are switched into the circuit. As noted earlier, the actual capacitors that are switched into and out of the variable capacitors have values that are different than the values that they contribute to the total capacitance because, amongst other reasons, the switches used to switch capacitors in and out of the circuit contribute to the effective capacitance of the circuit.

At least one existing solution recognizes that component tolerances can lead to gaps between the capacitance values that a variable capacitor can achieve (see US2018/0076788), but the known solution involves rounding down the larger capacitor values to the next standard value and continued use of a binary sequence of fractional-valued capacitors. This alleviates some of the gaps while the capacitance is increasing just after a full-valued capacitor has been added, but increases the gap just before another full-valued capacitor is to be added as the capacitance is increasing.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some embodiments of the disclosure may be characterized as a digital to analog converter (DAC), including a digital input, N contributors, an interconnect network, and an analog output. The N contributors each can have an on and an off state that is controlled by the digital input. The interconnect network can be coupled to each of the N contributors and the analog output. The interconnect network can be configured to provide a sum of contributions of the N contributors to the analog output. For each of the N contributors, a contribution of one of the N contributors can be a change in the analog output when the state of the one of the N contributors is changed from off to on and all remaining N−1 contributors' states remain the same. For each of the N contributors, the contribution of at least one of the N contributors can vary as the analog output is varied and a ratio of a maximum to a minimum of the contribution of the at least one of the N contributors is at least 1.1. The N contributors can be ordered from smallest to largest average contribution to form an ordering. A gap size, D, is less than or equal to two times a maximum of a contribution of a first of the N contributors. For k ranging from two to N, a maximum contribution of a $k^{th}$ contributor is less than or equal to D plus a sum of minimum contributions of contributor 1 through contributor k−1.

Other embodiments of the disclosure may also be characterized as a match network comprising one or more variable capacitors, each of the one or more variable capacitors including a digital input, N switched capacitors, an interconnect network, and an analog output. The N switched capacitors can each have an on and an off state that is controlled by the digital input and an output. The interconnect network can couple to each of the N switched capacitors and can be configured to provide a sum of the contributions of the N switched capacitors to a capacitance of the variable capacitor between terminals of the output. For each one of the N switched capacitors, a contribution of one of the N switched capacitors is a change in the variable capacitor capacitance when a state of the one of the switched capacitors is switched from off to on and all remaining N−1 switched capacitors' states remain the same. For each one of the N switched capacitors, the contribution of at least one of the switched capacitors varies across a range based on the states of the remaining N−1 switched capacitors. The N switched capacitors can be ordered from smallest to largest via an average of each switched capacitors' range of contributions to the variable capacitor capacitance. A gap size, D, is less than or equal to two times a maximum of a contribution of a first of the N switched capacitors. For k ranging from two to N, a maximum contribution of a $k^{th}$ switched capacitor can be less than or equal to D plus a sum of minimum contributions of switched capacitor 1 through switched capacitor k−1.

Other embodiments of the disclosure can be characterized as a method of forming a variable capacitor. The method can include providing a digital input, providing N switched capacitors coupled to each other via an interconnect topology; providing an analog output, from the interconnect topology as a sum of capacitance contributions of the N switched capacitors; and selecting the N capacitors to form a sub-binary sequence, where a maximum contribution of a $k^{th}$ switched capacitor is less than or equal to a gap size, D, plus a sum of minimum contributions of a first to a $(k-1)^{th}$ switched capacitor.

In another embodiment, a method is disclosed for using a match network. The method can include providing a digital input to a variable capacitor of the match network; setting a switch configuration corresponding to the digital input, wherein the switch configuration controls an on or off state of N switches in the variable capacitor, each of the N switches making a serial connection between one of N capacitors and an interconnect topology, wherein the interconnect topology provides a sum of capacitances of the N capacitors to an output, wherein for each of the N capacitors: a contribution to the sum of capacitances is a difference in the sum of capacitances when one of the N capacitors is switched from on to off and all remaining N−1 capacitors' states remain the same, and the contribution to the sum of capacitances varies across a range based on the states of the remaining N−1 capacitors; wherein a gap size, D, between a maximum contribution of one of the N capacitors and a minimum contribution of a successive one of the N capacitors, is less than or equal to two times a maximum of a contribution of a first of the N capacitors, where the N capacitors are ordered according to an average contribution across each of their ranges of contributions, wherein for k ranging from two to N, a maximum contribution to the sum of capacitances of a $k^{th}$ capacitor is less than or equal to D plus a sum of minimum contributions of the first to a $(k-1)^{th}$ capacitor; and passing a voltage or current through the match network, wherein an impedance seen by the voltage or current is influenced by the sum of capacitances of capacitances of the N capacitors.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 6:
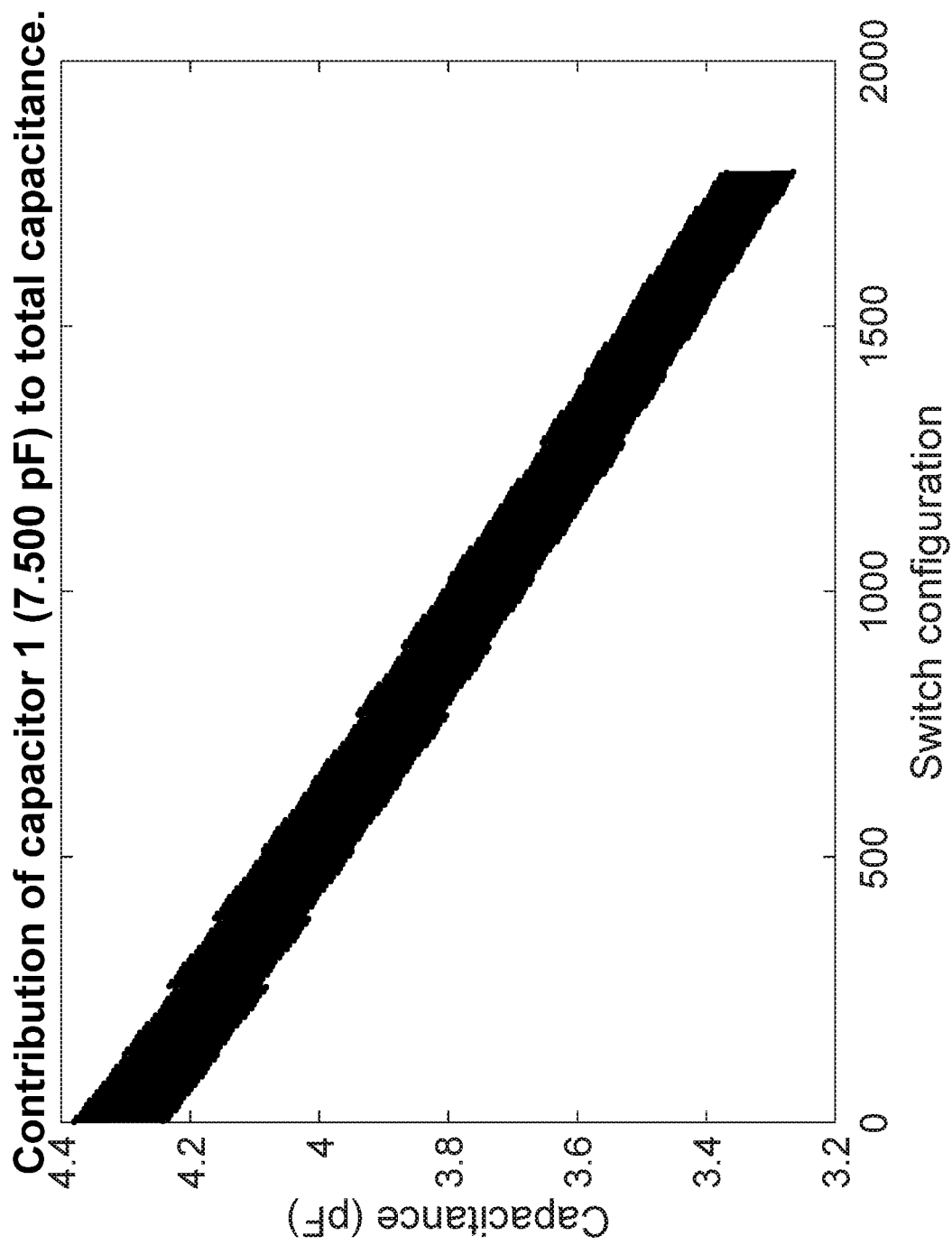
FIG. 6 illustrates the contribution to the analog output by the smallest fractional contributor as a function of the digital input.

A problem that appears in the context of variable capacitors utilizing switched capacitors is that each switched capacitor contributes a varying amount to the total capacitance when switched in, depending on the total capacitance of the variable capacitor. For instance, as is illustrated in FIG. 6 in combination with FIG. 13, if the total capacitance of the variable capacitor (e.g., 202 or 204) is small, such as 1 nF, then a 7.5 pF fractional capacitor with a 4.17 pF contribution (meaning that switching this 7.5 pF capacitor into the circuit should nominally change the total capacitance of the variable capacitor by 4.17 pF) may actually contribute 4.4 pF to the total, whereas that same 7.5 pF fractional capacitor may contribute only 3.3 pF when the total capacitance of the variable capacitor is high, such as 3.5 nF. This variability is in part a result of parasitic effects of the structures used to connect the capacitors in a variable capacitor to common input and output nodes. The plots in FIGS. 6-10, discussed in detail later, show an example of simulated capacitance values for capacitors as a function of switch configuration. The switch configuration, is used herein to mean some combination of switched capacitors being switched in and out of the variable capacitor to produce a capacitance for the variable capacitor.

For instance, in FIG. 6 we see a simulated plot of a capacitance contribution of a 7.5 pF capacitor as a function of switch configuration. Switch configuration indicates different configurations of switches being on or off, and thus coupling switched capacitors in or out of the variable capacitor. For each switch configuration, there is a resulting capacitance contribution for this 7.5 pF capacitor as shown on the y-axis. In this non-limiting example, as the number of switched capacitors switched into the variable capacitor increases, the contribution from the 7.5 pF capacitor generally decreases (though the localized value as switch configuration increases actually jumps up and down). To derive these simulated results, the 7.5 pF capacitor is switched on and off for every switch configuration to determine a capacitance difference, or contribution, between these two states for every switch configuration. Component tolerances may also contribute to this variability. It should be noted, that while the simulations shown in FIGS. 6-10 show what appear to be downward relationships between capacitance contribution and switch configuration, this is illustrative only, and in other embodiments the minimum and maximum contributions could occur anywhere in the plot.

Traditionally, variable capacitors utilizing switched capacitors are formed from a binary sequence of "fractional contributors," such as 5 pF, 10 pF, and 20 pF along with one or more "full-valued contributors," such as 40 pF. In this example, if these four capacitors alone are implemented in a variable capacitor, the resulting variable capacitor might have a "base value" (capacitance contribution with all switched capacitors switched out of the variable capacitor) of 50 pF, and thus could contribute between 50 and 125 pF of capacitance. The maximum contribution of 125 pF comes from the base value, 50 pF, plus the contribution of all four capacitors, 75 pF (5+10+20+40), when switched "on" or in to the variable capacitor, which gives 125 pF. It should be noted that these values are not the actual values of the four capacitors, but rather merely the change in capacitance that occurs when one of these capacitors is switched. The lowest switch configuration, providing a 50 pF contribution, can have a switch configuration or digital capacitor setting of 0 (the lowest value of the variable capacitor), and the highest switch configuration, providing a 125 pF contribution, corresponding to a switch configuration or digital capacitor setting of 31 (or anther convenient number, e.g., 1). In this example, the contributions can have a 5 pF step size. In other words, the digital input of 0 to 31, sets the variable capacitor analog output between 50 and 125 pF with 5 pF steps between total capacitance values.

If this variable capacitor were modified to include three additional full-valued 40 pF capacitors, the base contribution might increase from 50 pF to 66 pF, and the variable capacitor could contribute between 66 pF and 261 pF (66+40*4+20+10+5=261). By switching combinations of these fractional and full-valued capacitors into the variable capacitor, a range of capacitance values between the minimum (e.g. 66 pF) and maximum (e.g. 261 pF) can be achieved. For such a variable capacitor the expected step in capacitor contribution when the switch configuration or digital input is incremented by one (the "step size") could again be 5 pF, or the same value as the smallest fractional contributor. In practice it has been found that the actual step size can be many times larger than the expected step size. Larger step sizes can lead to gaps in the capacitor values that can be achieved. Typically, a match network is designed so that it can match the input impedance of the match to a desired input impedance with sufficient tolerance where the gaps in the capacitor values are below some threshold, e.g. 5 pF. Thus, these gaps are problematic as they leave a match incapable of impedance matching in certain situations.

Figure 1:
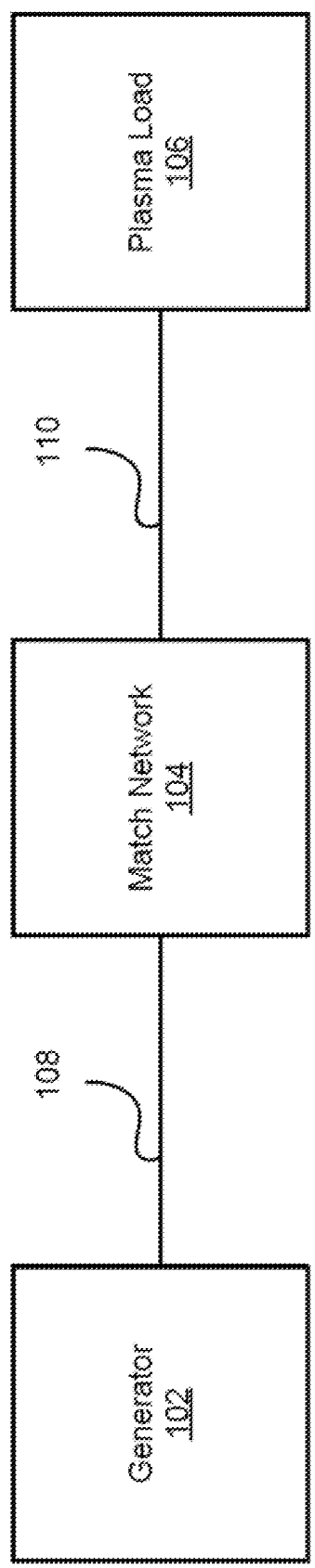
FIG. 1 illustrates a typical generator, match network, and plasma load system.
Figure 2:
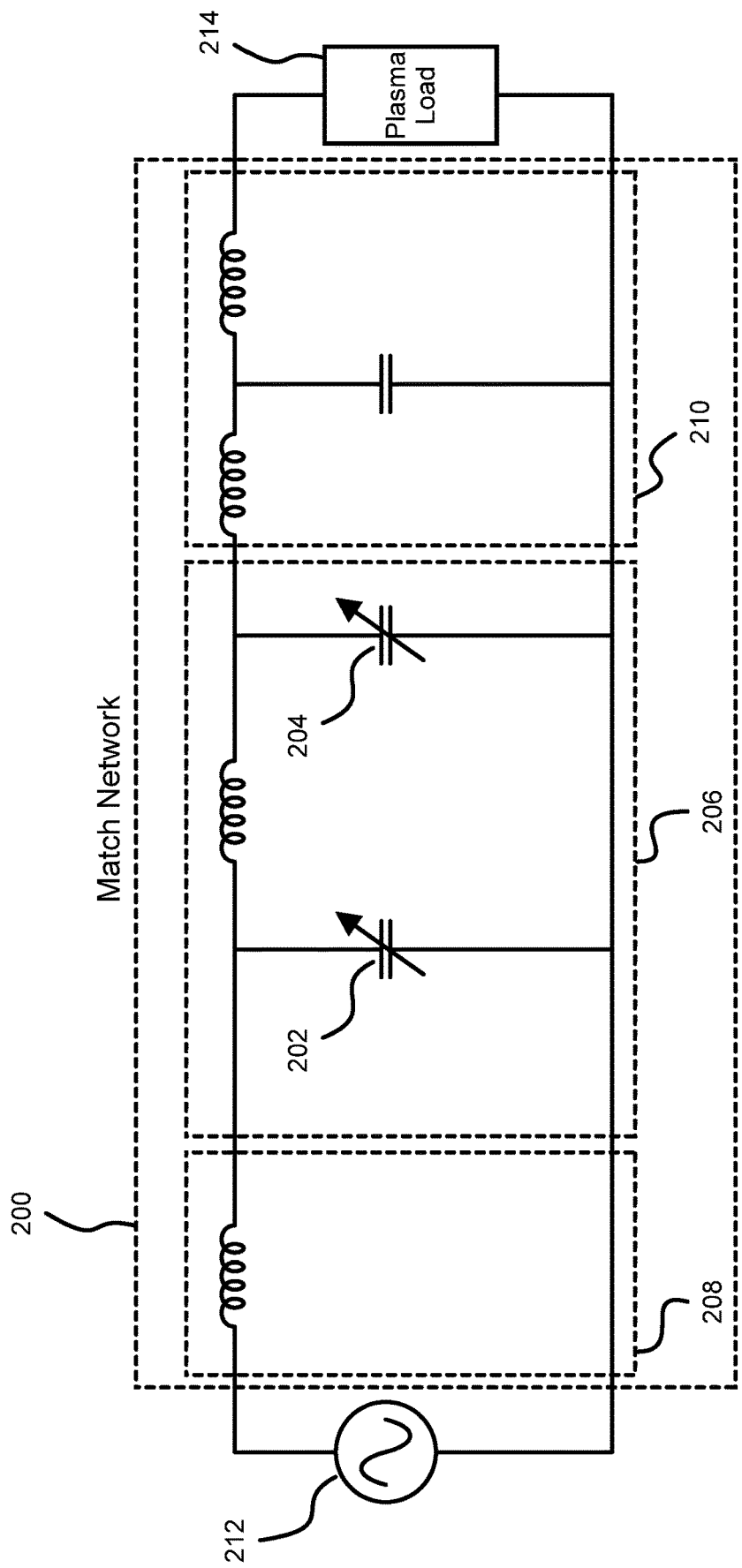
FIG. 2 illustrates a plasma processing system including a match network having a variable reactance section.
Figure 3B:
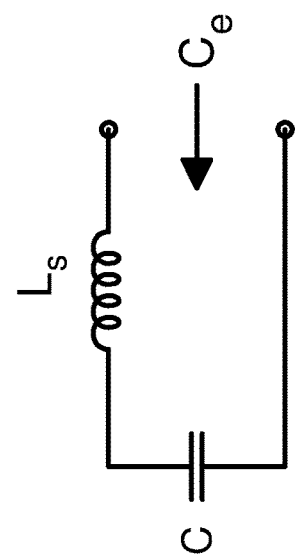
FIG. 3B illustrates an equivalent circuit for FIG. 3A.
Figure 3A:
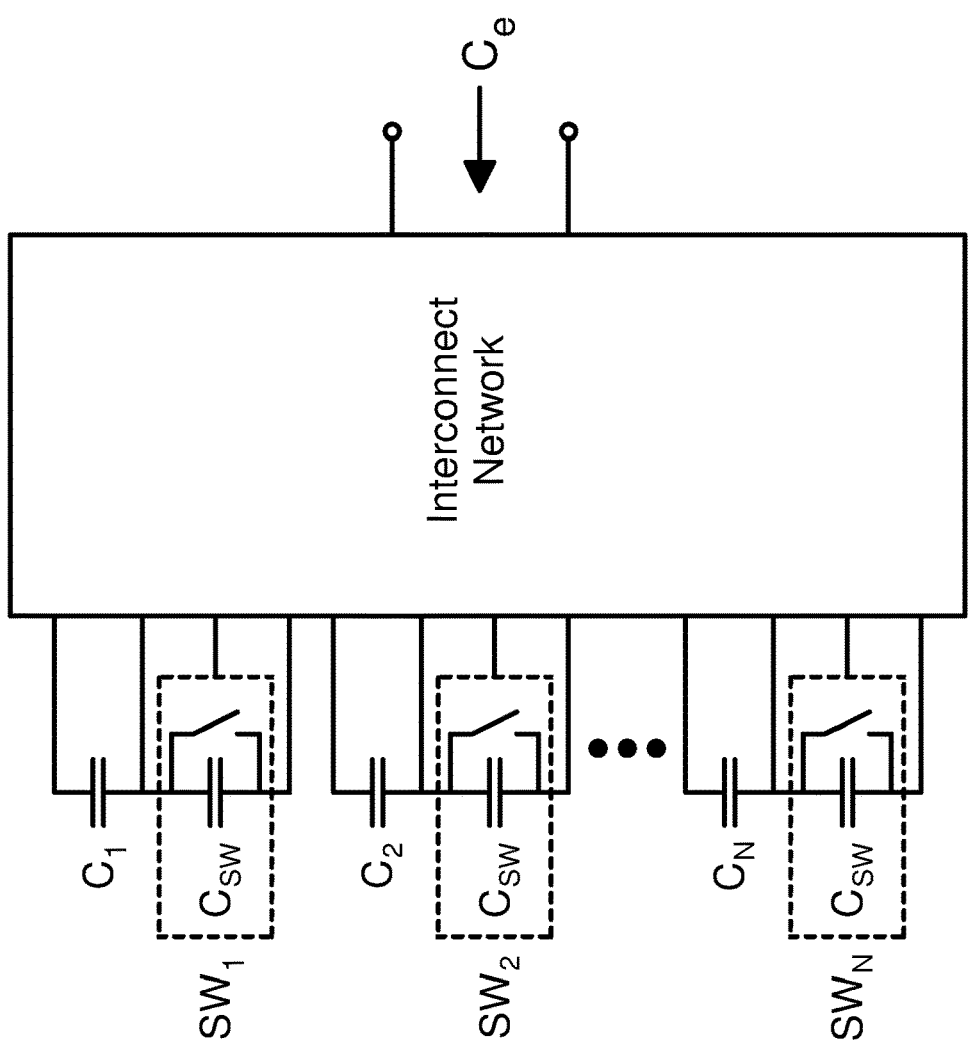
FIG. 3A illustrates an embodiment of a variable capacitor utilizing switched capacitors.

To help illustrate the herein-disclosed solution to these problems, FIG. 3A illustrates a variable capacitor circuit diagram embodying aspects of the present disclosure. In particular, FIG. 3A illustrates a variable capacitor utilizing switched capacitors. In FIG. 3A capacitors $C_1$ through $C_N$ are in series with switches $SW_1$ through $SW_N$, respectively. Each switch has an off-state capacitance $C_{SW}$ and the capacitors and switches are connected through an interconnect network. For analysis purposes the interconnect network should model the effects of the network connecting the capacitors and switches to the terminals of the variable capacitor and may include parasitic elements of the switch drivers etc. From this model of the variable capacitor an equivalent network of the variable capacitor such as the one shown in FIG. 3B may be derived in which a parasitic series inductance, $L_S$, is extracted from the network. This parasitic inductance can be included in the design of the match network. The capacitor C in FIG. 3B that remains after removing parasitic elements such as $L_S$ is the capacitor value that is used in further analysis of the capacitor. Although this looks like a trivial detail, failing to remove nominal parasitic elements leads to difficulty in determining the range of values a particular switched capacitor contributes to the total capacitance as the total capacitance is varied. For example, a capacitor in which C in FIG. 3B varies between 1 and 4 nF in series with a 20 nH inductor ($L_S$ in FIG. 3B) will produce a $C_e$ in FIGS. 3A and 3B that varies between 1.17 nF and 9.54 nF when measured at 13.56 MHz. Parasitic elements may be extracted by measuring $C_e$ at different frequencies and fitting a circuit model to the measured data assuming that C in FIG. 3B is not dependent on frequency.

While the prior art has sought to address the above-noted gaps in the variable capacitor value based on issues of capacitor tolerance, parasitics can make these gaps even larger than expected when only capacitor tolerance is considered. Namely, each fractional capacitor has a varying contribution depending on the total capacitance given by the capacitor setting. As more of the capacitors are switched into the variable capacitor, a contribution from any one of the capacitors, especially smaller ones, changes. This can lead to larger gaps than expected by the prior art, which merely accounts for gaps caused by device tolerances—not parasitics.

Figure 4:
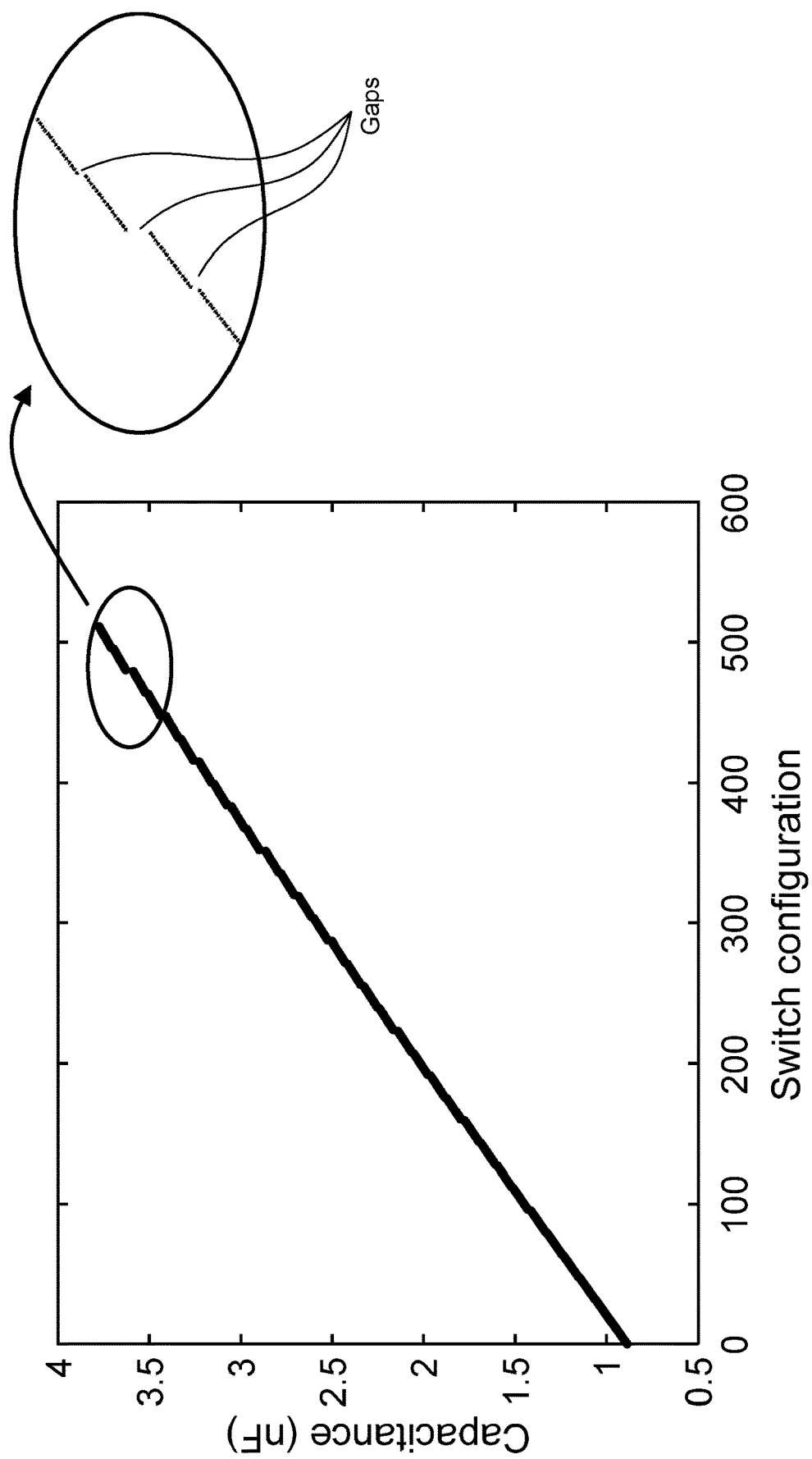
FIG. 4 illustrates a plot of an analog output as a function of a digital input where binary fractional values are used.

FIG. 4 shows total capacitance of a variable capacitor as a function of switch configuration where binary fractional capacitor values are used in a circuit such as depicted in FIG. 3A, leading to gaps between total capacitance values. Referring to FIG. 3A, switch configuration is defined as $M2^{N_{frac}} + \Sigma_{k=1}^{N_{frac}} S_k 2^{k-1}$ where M is the number of full valued capacitors that are switched into the variable capacitor, $N_{frac}$ is the number of fractional capacitors, and $S_k$ is one if a switch $SW_k$ is on and zero if a switch $SW_k$ is off. For a switched variable capacitor employing a small number of switches one can simply consider all possible switch configurations irrespective of whether a switch is associated with a fractional or full valued capacitor, but this becomes impractical for a switched variable capacitor with a large number of full valued capacitors (e.g., greater than 15 or greater than 20). Consider, for instance, the case of a variable capacitor with 5 fractional and 45 full valued capacitors. Considering all combinations of fractional capacitors but turning on the full valued capacitors in a defined sequence, the number of possible combinations considered is 46×2⁵=1472. Making no distinction between fractional and full valued capacitors and considering all possible combinations, the number of possible combinations is $2^{50}$ which is an astronomical number (it will take 35 years to measure all configurations if a measurement is made every microsecond).

Figure 5:
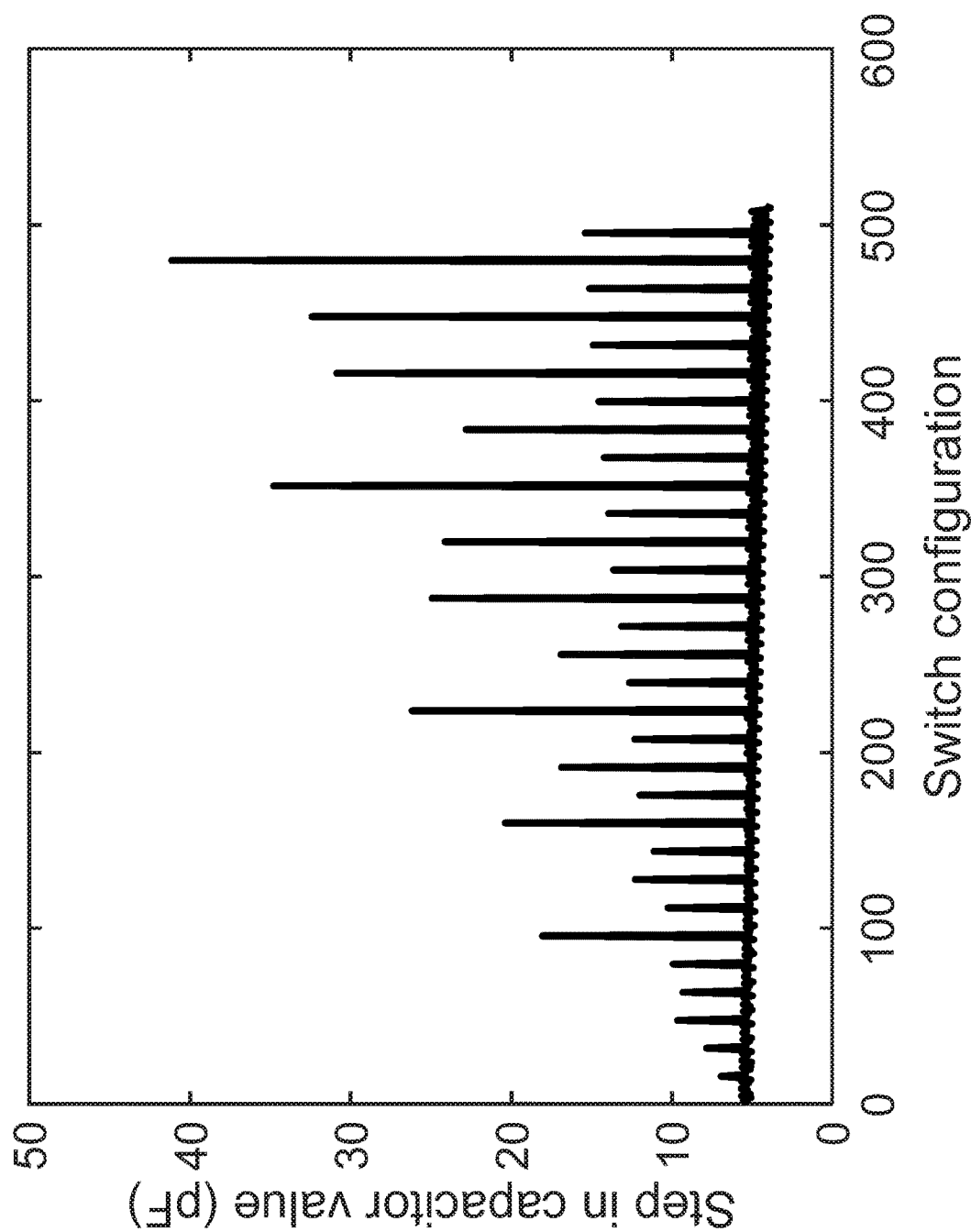
FIG. 5 illustrates the step in analog output when the digital input is incremented by one for the relationship illustrated in FIG. 4.

FIG. 5 shows one illustration of steps in capacitance for a variable capacitor as the switch configuration is incremented by ones. From FIG. 4 and FIG. 5 one can see that there are large gaps in the total capacitance. The gaps are on the order of eight times the expected 5 pF gap (since the smallest fractional contributor is 5 pF in the example) and are a result of failing to take into account the effects of the interconnect network of FIG. 3A and the resulting changing contributions of the switched capacitors to the total capacitance of the variable capacitor as the total capacitance varies, as depicted in FIGS. 6-10.

The proposed solution is to consider the influence of all effects, including but not limited to the impact of the interconnect network of FIG. 3A and component tolerance, and choose a "sub-binary" sequence of fractional values when designing a variable capacitor (rather than a "binary" sequence).

For the purposes of this disclosure, a "sub-binary" sequence is a sequence of numbers in which the ratio between successive numbers is less than two. For instance, and in the case of capacitor values, a binary sequence could include 5 pF, 10 pF, 20 pF, and 40 pF where each value is larger than the previous value by a factor of 2, whereas a sub-binary sequence could include 5 pF, 8.4 pF, 14.1 pF, 23.8 pF, and 40 pF, or 5 pF, 7.6 pF, 11.6 pF, 17.6 pF, 26.7 pF, and 40 pF where each value is larger than the previous value by a factor less than 2. It should also be noted that since the herein disclosed sub-binary sequences involve values that are closer together than those in the binary equivalents of the prior art, one or more extra capacitors (contributors) may be needed in the variable capacitor to ensure that the sequence can cover the same range of values as a traditional binary sequence. For instance, to cover the range of the binary sequence including the values 5 (fractional), 10 (fractional), 20 (fractional), and 40 (full-valued), one example sub-binary sequence may include an additional fractional value to cover the same range (e.g., 5 (fractional), 8.4 (fractional), 14.1 (fractional), 23.8 (fractional), and 40 (full-valued)). Thus, the proposed solution, in one sense, actually adds complexity, cost, and components, and would therefore not be an obvious design choice to one of skill in the art.

Figure 11:
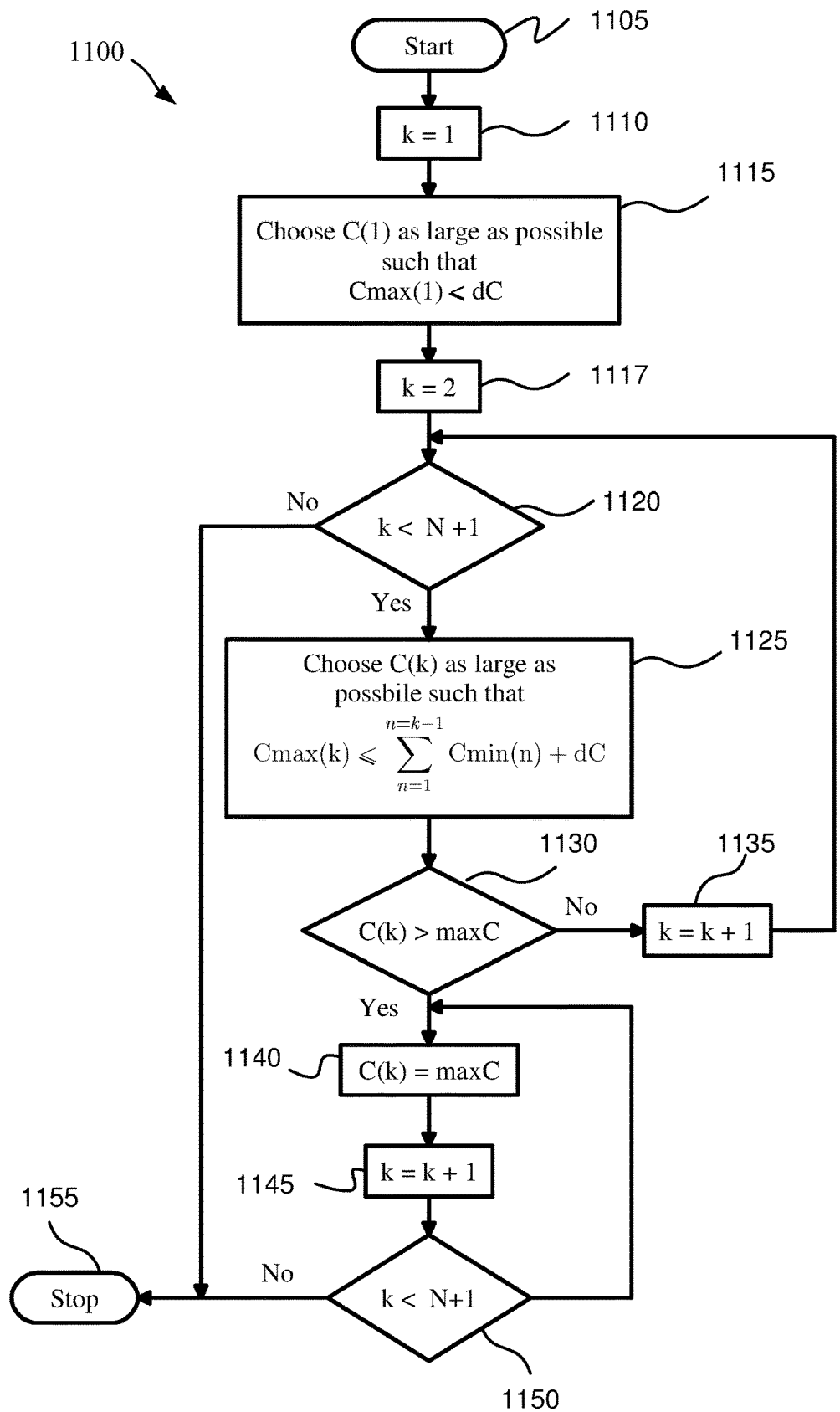
FIG. 11 is a method for computing the values of contributors to ensure a maximum step in analog output when the digital input is incremented by one.

FIG. 11 shows a procedure for creating a sub-binary sequence of capacitor values to ensure that a maximum gap, dC, in the variable capacitor value (total capacitance of the variable capacitor) is not exceeded in a variable capacitor utilizing switched capacitors with a total on N switched capacitors and a maximum capacitor value of maxC. The method 1100 of FIG. 11 will be described with reference to example circuits and the capacitance plots thereof shown in FIGS. 6-10. Before starting the procedure (Block 1105), an initial design of the variable capacitor as shown in FIG. 3A can be analyzed. The properties of the interconnect network of FIG. 3A can be analyzed using standard techniques (e.g. electromagnetic field (e.g. HFSS) and circuit analysis (e.g. SPICE and MATLAB) simulation software). With the properties of the interconnect network known and with an initial estimate (e.g. assuming a binary sequence of contributions such as 5, 10, 20, and 40 pF together with an estimate of switch capacitance of e.g. 6 pF yields a sequence of 8.5, 14.2, 24.8, and 45.3 pF) of the switched capacitor values that could be used, the total capacitance of the variable capacitor can be calculated for all switch configurations. When nominal parasitic elements are removed from the circuit, one can arrive at an equivalent circuit such as FIG. 3B. For each switch configuration (the x-axis in FIGS. 6-10), each switched capacitor is switched into and out of the variable capacitor circuit to find a simulated contribution of the switched capacitor to the total capacitance of the variable capacitor (C in FIG. 3B) as a function of switch configuration. The result of this procedure is a set of data, such as depicted in FIG. 6, for every switched capacitor in the variable capacitor, including simulated minimum and simulated maximum contributions for each switched capacitor. For instance, the 7.5 pF capacitor of FIG. 6 has a maximum contribution, Cmax(1), of around 4.4 pF and a minimum contribution, Cmin(1) of around 3.3 pF. This type of data can be simulated for each switched capacitor in the variable capacitor. For instance, FIGS. 6-10 represent data for four of twenty switched capacitors in a variable capacitor having seven fractional and thirteen full valued switched capacitors. Given the Cmax and Cmin from these sets of data for each switched capacitor, the method 1100 can then use these simulated minimum and maximum contributions for each switched capacitor to perform an iterative set of steps to determine optimal switched capacitor values that reduce the gap between values seen in the prior art (e.g., the gaps in FIG. 4).

In particular, FIG. 11 shows a method 1100 where a first fractional value is selected to have a maximum contribution, Cmax(1), less than a desired gap size, dC, and all subsequent fractional values can be selected so that the maximum contribution, Cmax(k), of the next fractional value is equal to or less than a sum of minimum contributions of all previously chosen fractional values plus the maximum step size. In equation form, this can be written as, for the $k^{th}$ contributor with $k>1$:

$$C\max(k) \leq (\Sigma_{n=1}^{k-1} C\min(n)) + dC \quad \text{Equation (1)}$$

This results in a sub-binary increasing set of fractional values, which may contain one or more additional fractional values than the typical binary sequence. Further, once Cmax(k) values are determined, actual capacitors can be selected, keeping in mind that selection is often limited to standard capacitor values (hence the concept that Cmax(k) is to be equal to or less than some value).

For instance, simulation may show that a first fractional value has a maximum contribution, Cmax(1) of 5 pF, and a minimum contribution, Cmin(1) of 3 pF (e.g., accounting for parasitic and tolerance effects). Using Equation 1, the maximum contribution of the second fractional value, Cmax(2) can be equal to or less than the minimum contribution of the first fractional value plus the desired step size or 3 pF+5 pF=8 pF. Further simulation can show a minimum contribution, Cmin(2) for this second fractional value of 6 pF. Equation 1 then gives a Cmax(3) for a third fractional value equal to or less than the minimum contribution of the first and second fractional values (3 pF+6 pF=9 pF) plus the step size (e.g., 5 pF) or 3 pF+6 pF+5 pF=14 pF. Simulation can then show that a minimum contribution, Cmin(3) of the third fractional value is 11 pF. Equation 1 then gives a Cmax(4) for a fourth fractional value equal to or less than a sum of minimum fractional values for the previous fractional values plus the step size or 3 pF+6 pF+11 pF+5 pF=25 pF. Simulation can then show a minimum contribution, Cmin(4), for this fourth fractional value of 19 pF. So, for this example step size, dC, of 5 pF, the maximum contributions of the first four fractional values may be equal to or less than 5 pF, 8 pF, 14 pF, and 25 pF.

Given these maximum contributions, Cmax(k), for the fractional-valued capacitors, maximum contributions for full-valued capacitors can be selected. The full-valued capacitors also use Equation 1, and thus have a Cmax(5) equal to or less than 3 pF+6 pF+11 pF+19 pF+5 pF=44 pF. Any number of full-valued capacitors having this Cmax(5) may be implemented.

Given these maximum contributions, Cmax(k), actual capacitor values, C(k), that result in these maximum contributions are then selected, keeping in mind that capacitors come in standard values, and thus the actual capacitor value may not correspond to the calculated C(k) values determined above. Once actual capacitor values are selected, the sub-binary solution may be iterated to ensure that the selected capacitor values still lead to a viable solution, and if needed, changes to the selected capacitors can be made.

Details of FIG. 11 will now be addressed, using a specific example as the discussion progresses. Starting with the first switched capacitor, k=1 (Block 1110), Block 1115 develops a set of data, such as FIG. 6, for the first switched capacitor (e.g., capacitance, C(1)=7.5 pF), and finds a range of simulated contributions for the first switched capacitor (e.g., between 3.27 and 4.38 pF according to FIG. 6)). With a switch capacitance, $C_{SW}$ of FIG. 3A (e.g., 6 pF), the expected contribution of the combination of $C_1$ and $SW_1$ is the difference between their combined capacitances in the on and off states (e.g., 7.5−1/(1/7.5+1/6) pF=4.17 pF) (Note that $C_k$ in FIG. 3A is C(k) in FIG. 11). In the FIG. 6 example, the actual capacitance contribution varies between 78% and 105% of the expected 4.17 pF contribution. Block 1115 then targets a maximum gap, dC (e.g., 5 pF), and determines what the value of the first switched capacitor, C(1), should be that results in a maximum contribution of the first capacitor, Cmax(1), that is less than or equal to the maximum gap, dC. In the example, the nominal contribution of the first switched capacitor is 5/1.05=4.76 pF to ensure that the maximum contribution, is less than 5 pF (i.e., gap size, dC, divided by the maximum ratio of actual contribution to expected contribution as determined by simulated data (e.g., FIG. 6) and the expected contribution obtained through calculation).

Returning to the example of FIG. 6, the switched capacitor should thus have a capacitance, C(1), no greater than $$\frac{4.76}{2} + \sqrt{\left(\frac{4.76}{2}\right)^2 + 4.76 \times 6} \ \text{pF} = 8.23 \ \text{pF}.$$

Block 1115 can then subtract capacitor tolerance from this calculated value to arrive at a desired capacitance of the first switched capacitor, C(1). In the example, and assuming a capacitor tolerance of 0.5 pF, the maximum capacitance for the first switched capacitor, C(1), is 7.73 pF (e.g., 8.23 pF−0.5 pF). Block 1115 can then determine a closest standard capacitance that is smaller than C(1), which in the example is 7.5 pF. Thus, the first switched capacitor capacitance, C(1) in this example, as determined in step 1115, is 7.5 pF.

Figure 7:
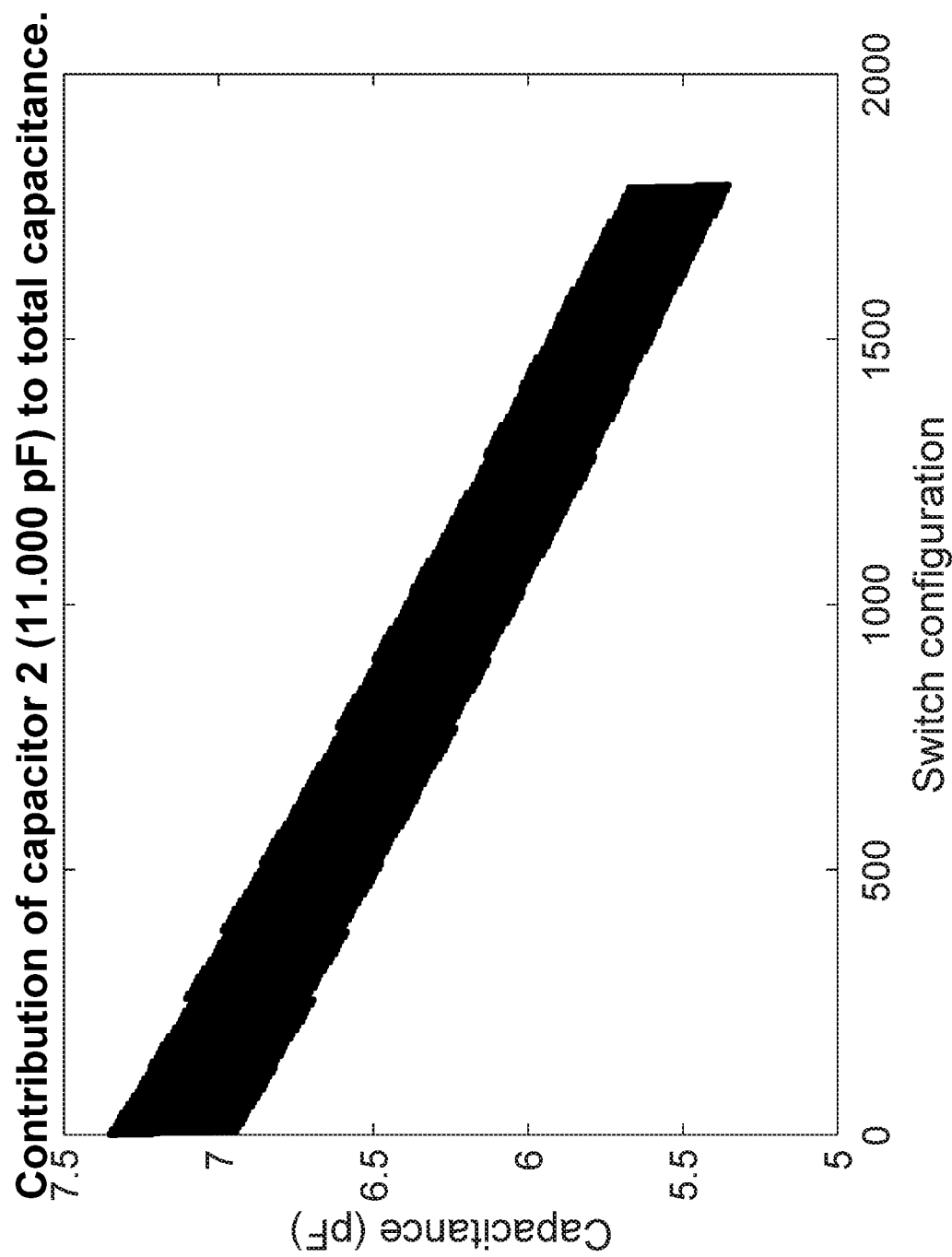
FIG. 7 illustrates the contribution to the analog output by the second smallest fractional contributor as a function of the digital input.
Figure 8:
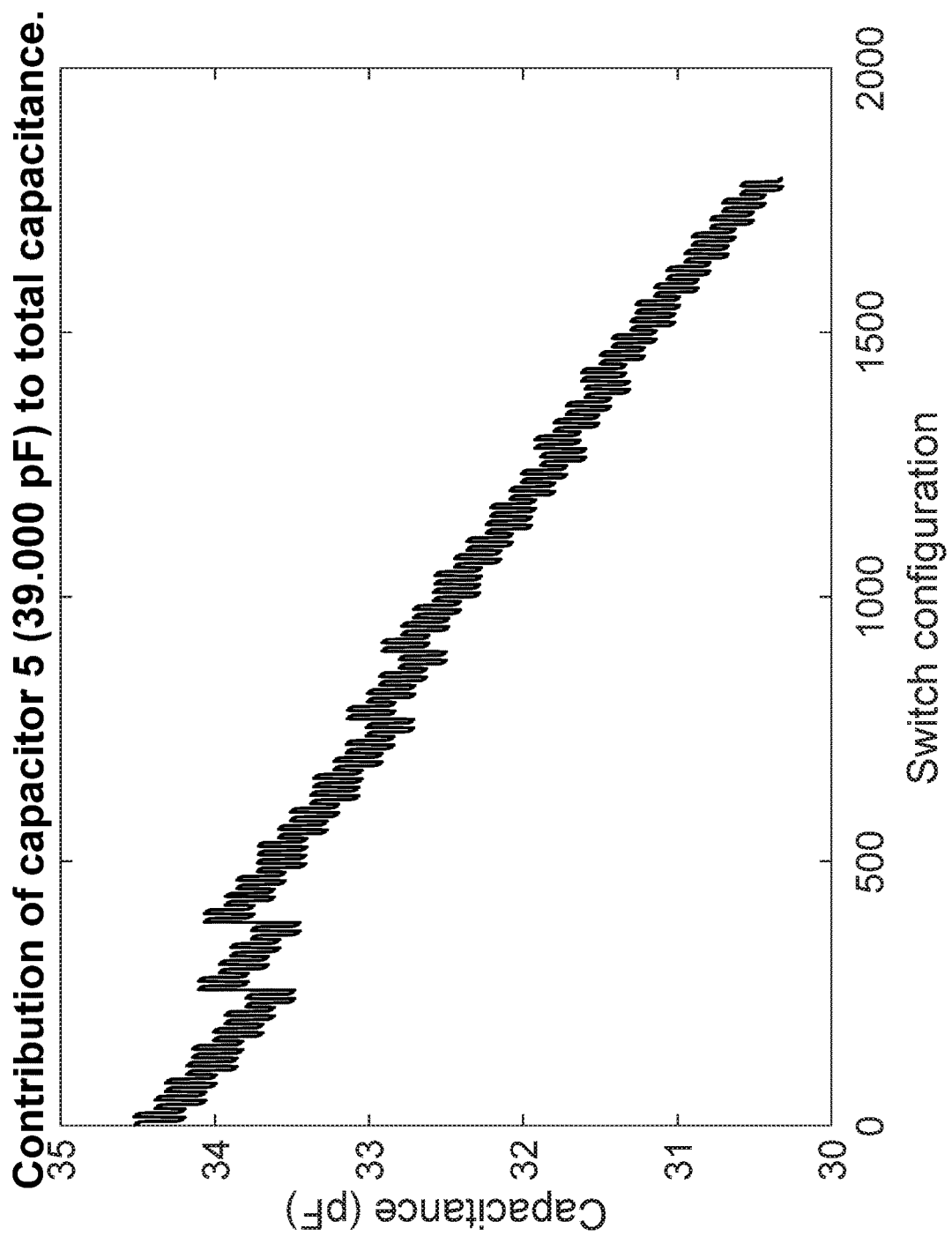
FIG. 8 illustrates the contribution to the analog output by the fifth smallest fractional contributor as a function of the digital input.
Figure 9:
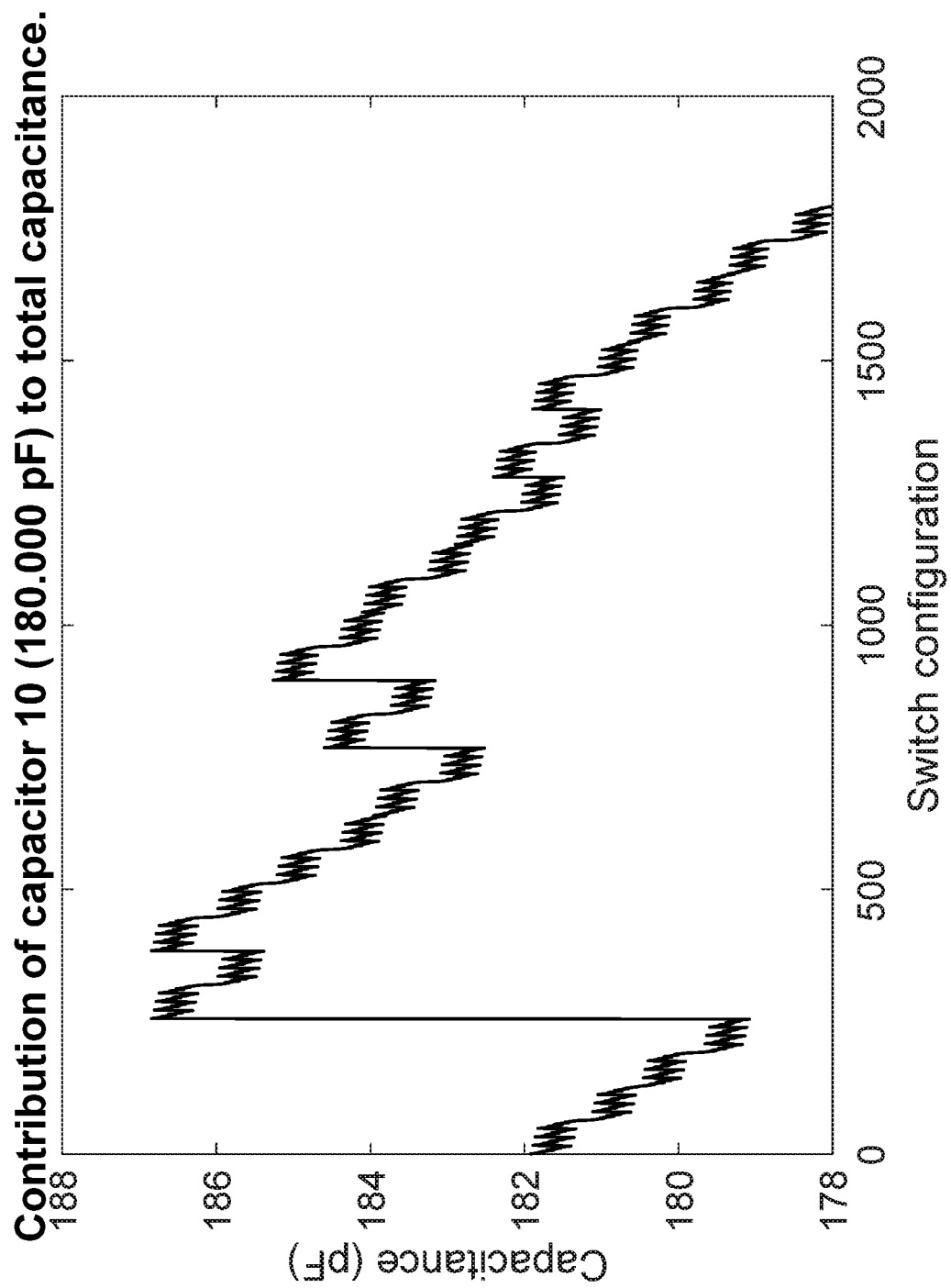
FIG. 9 illustrates the contribution to the analog output by the third full-valued contributor ($10^{th}$ contributor overall including 7 fractional contributors) as a function of the digital input.
Figure 10:
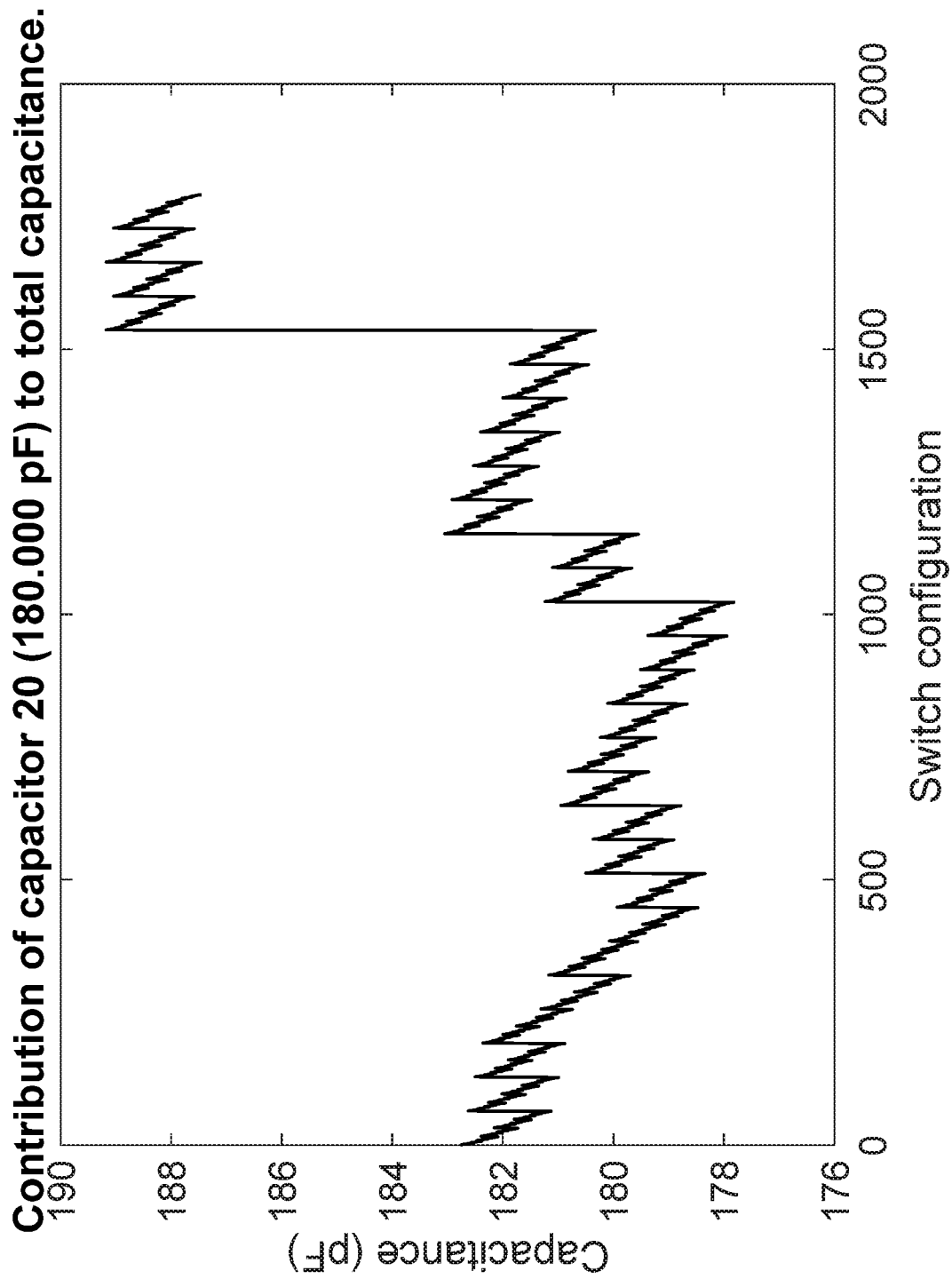
FIG. 10 illustrates the contribution to the analog output by the thirteenth full-valued contributor ($20^{th}$ contributor overall including 7 fractional contributors) as a function of the digital input.

In this example, the capacitor used to simulate the minimum and maximum contributions and the capacitor selected via Block 1115 are the same. However, in other cases, the simulated capacitor and the one selected by Block 1115 may be different. In these cases, subsequent analysis (i.e. after calculating all switched capacitor values, the circuit is analyzed with the new capacitor values and all calculations of FIG. 11 repeated) typically converges quickly to a final set of switched capacitor values, C(k). With a first capacitor value, C(1), in hand, determining the second capacitor value, C(2), involves the maximum step size, dC, and the minimum contribution of the first capacitor value, C(1). So, a minimum contribution of the first switched capacitor is determined (Block 1125). The minimum expected contribution of a first capacitor, $C_1$, Cmin(1) is calculated as 0.78*[(7.5−0.5)−1/(1/(7.5−0.5)+1/6)] pF=2.94 pF, which can be seen to be less than the simulated minimum value seen in FIG. 6 which only accounts for parasitic effects and neglects component tolerance. The second fractional value can be selected so that the maximum contribution of the second fractional value, Cmax(2) is as large as possible while being equal to or less than the minimum contribution, Cmin(1) of the first fractional value plus the maximum step size, dC, (step 1125 with k=2). In the example, the maximum contribution of a second capacitor, $C_2$, Cmax(2), should thus be equal to or less than 2.94+5 pF=7.94 pF. The simulated maximum and simulated minimum contributions of $C_2$ to the total capacitance, Cmax(2) and Cmin(2), respectively is again found via simulation and calculation as noted above. In our example, FIG. 7 shows this simulation for $C_2$ having a value of 11 pF. From FIG. 7 the contribution of $C_2$ to the total capacitance is found to be between 75% and 103% of the expected contribution of $C_2$. The expected contribution of $C_2$ should thus be no more than 7.94/1.03 pF=7.7 pF which in turn means $C_2$ should be no more than 11.66 pF. Assuming a 2% capacitor tolerance, the maximum value of C(2) should be no more than 11.66/1.02 pF=11.43 pF. The largest standard capacitor value that is less than 11.43 pF is 11 pF. The value of $C_2$, C(2), is thus selected to be equal to 11 pF, which also happens to be the same value used in the simulation. This selected capacitor value of C(2)=11 pF is not greater than maxC, which in this example is set to 180 pF based on the maximum current that the switch can handle (Block 1130), so method 1100 iterates (Block 1135) to choose a capacitor value for C(3) (Block 1125) as the total number of switched capacitors (N) has not been reached (Block 1120).

The minimum contribution of $C_2$, Cmin(2) is found to be 0.75 times $$\left[0.98 \times 11 - 1 \bigg/ \left(\frac{1}{(0.98 \times 11)} + \frac{1}{6}\right)\right] \text{pF} = 5.19 \ \text{pF},$$

and so on as method 1100 loops through its calculations.

The method 1100 can loop through step 1125 until all contributors have been accounted for (i.e., when k<N+1 at decision 1120 or 1150). This results in a sub-binary increasing set of fractional values, which may contain one or more additional fractional values than the typical binary sequence. The process can terminate at step 1120 when N fractional values have been selected and no full-valued capacitors are needed, or a number of full valued capacitors are selected in step 1140. There may be many full valued capacitors required so when the maximum contribution for full valued capacitors is determined in step 1125 one should use the maximum for all full valued capacitors. As an example, referring to FIGS. 9 and 10, capacitor C(10) is found to contribute up to 1.07 of the expected contribution and capacitor C(20) up to 1.09 of the expected contribution. Looking at all full valued capacitors one may find that the maximum ratio of maximum to expected contribution is 1.10 and then the factor 1.1 should be used to find the maximum value that the full valued capacitors should be.

As noted earlier, since one or more extra bits may be needed in a sub-binary sequence to cover the range of a binary sequence, the herein disclosed solution adds complexity and cost to previous attempts. Despite the added complexity and cost, the sub-binary sequence unexpectedly allows smaller gaps, allows a user or administrator to select a maximum step size with confidence, and thereby enables more accurate tuning of the match.

Figure 12:
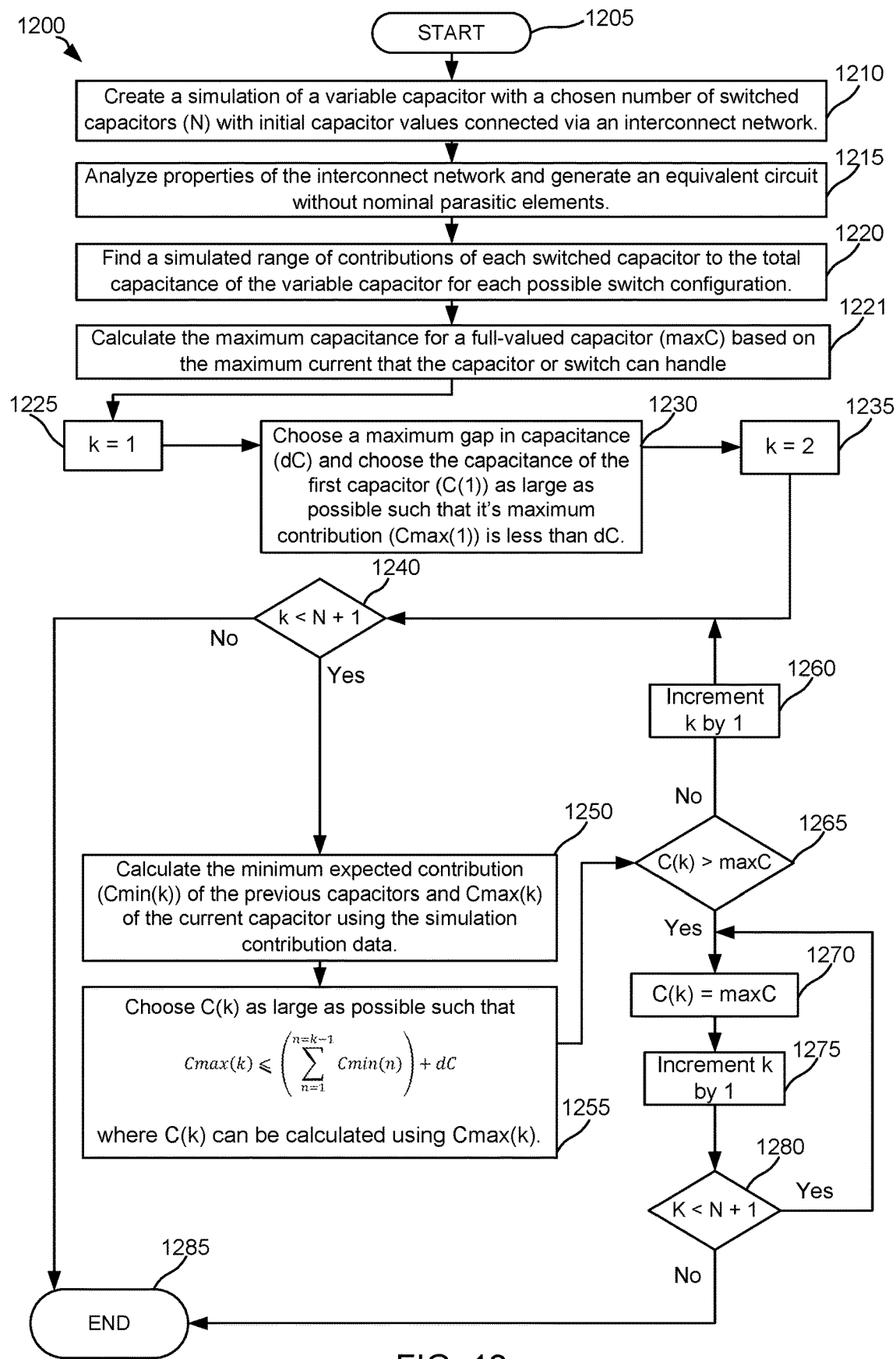
FIG. 12 is a more detailed embodiment of the method described and shown relative to FIG. 11.

FIG. 12 illustrates another embodiment of a procedure for creating a sub-binary sequence of capacitor values to ensure that a maximum gap, dC, in the variable capacitor value is not exceeded in a variable capacitor utilizing switched capacitors with a total of N switched capacitors that each have a maximum possible capacitor value of maxC. First, in Block 1210, a simulation of a variable capacitor with N switched capacitors connected by an interconnect network, such as the variable capacitor in FIG. 3A, is created and initial capacitor values are chosen for the switched capacitors. Using this simulation, the properties of the interconnect network are then be analyzed in Block 1215, and an equivalent circuit without nominal parasitic elements, such as the circuit in FIG. 3B, is generated using those properties. Next, in Block 1220, a simulated range of contributions of each switched capacitor to the total capacitance of the variable capacitor is found for each switch configuration. To find the simulated contributions of the switched capacitors, each switched capacitor is switched into and out of the variable capacitor circuit, and the difference between capacitance of the variable capacitor in the two switch states is determined to be the simulated contribution of the switched capacitor. This contribution determining process is repeated for all switch configurations to generate a mapping between the switch configuration and the simulated contribution of each switched capacitor, such as in FIGS. 6-10. Block 1221 calculates a maximum capacitance, maxC, for a full-valued switched capacitor based on the maximum current that a capacitor and switch can handle.

Then, starting with the first switched capacitor, k=1 (Block 1225), a maximum allowable gap in capacitance of the variable capacitor, dC, is chosen in Block 1230, and the capacitance of the first switch capacitor, C(1), is chosen such that its simulated maximum contribution, Cmax(1), is as large as possible while still being less than dC. Cmax(1) is found using the simulation contribution data produced in Block 1220 and is then used along with the capacitance of the switch portion of the first switched capacitor and the tolerance of the first switched capacitor to calculate the maximum desired capacitance of the first switched capacitor. Block 1230 can then determine a closest standard capacitance that is smaller than this maximum desired capacitance and assign that closest standard capacitance value to the first switched capacitor as C(1). Method 1200 then moves on to the second switched capacitor, k=2 (Block 1235), and checks if this switched capacitor is included in the total number of switched capacitors, N, in Block 1240. If this next switched capacitor is not included in the total number of switch capacitors, method 1200 proceeds to its end in Block 1285 since all switched capacitors in the variable capacitor have been assigned a capacitance value. Otherwise, method 1200 continues in Block 1250, the minimum expected contributions, Cmin(k), of all the switched capacitors previously assigned capacitance values, are added together along with dC to provide an upper limit for Cmax(k) (Block 1255). Each Cmin(k) value is calculated using the simulation contribution data produced in Block 1220 as well as the expected contribution of each switched capacitor with capacitor tolerances taken into account. Block 1255 then determines a closest standard capacitance that results in a maximum contribution equal to or less than this maximum desired capacitance contribution, Cmax(k), and assigns that closest standard capacitance value to the current switched capacitor as C(k).

Next, the assigned capacitor value, C(k), is compared to the maximum capacitance of a full-valued capacitor, maxC, (recall block 1221) in Block 1265. If the current switched capacitor assigned value, C(k), exceeds the maximum capacitance for a full-valued switched capacitor, maxC, then C(k) is overwritten to be equal to maxC in Block 1270. Additionally, the remaining switched capacitors are also assigned a capacitor value of maxC by repeatedly iterating to the next switched capacitor in Block 1275 and assigning it a value of maxC in Block 1270 until the iterations reach a switched capacitor number that is greater than the total number of switched capacitors, N, as determined in Block 1280. Otherwise, if C(k) assigned in Block 1255 does not exceed maxC, then the method 1200 continues on to the next switched capacitor in Block 1260 and repeats the process described above starting with Block 1240.

Figure 13:
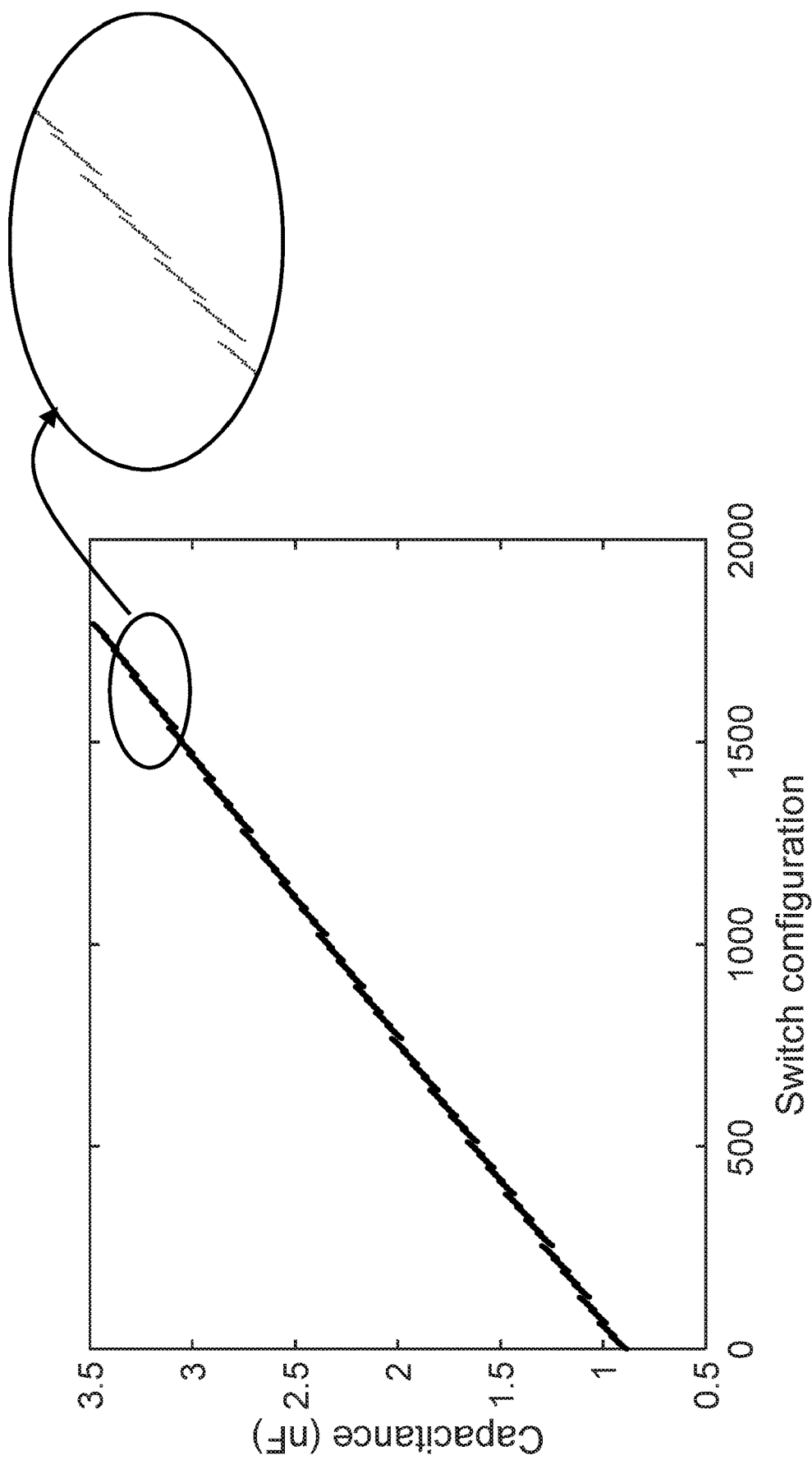
FIG. 13 illustrates an analog output as a function of a switch configuration when the values of the individual contributors, in an embodiment, are calculated in accordance with the method of FIG. 11.
Figure 14:
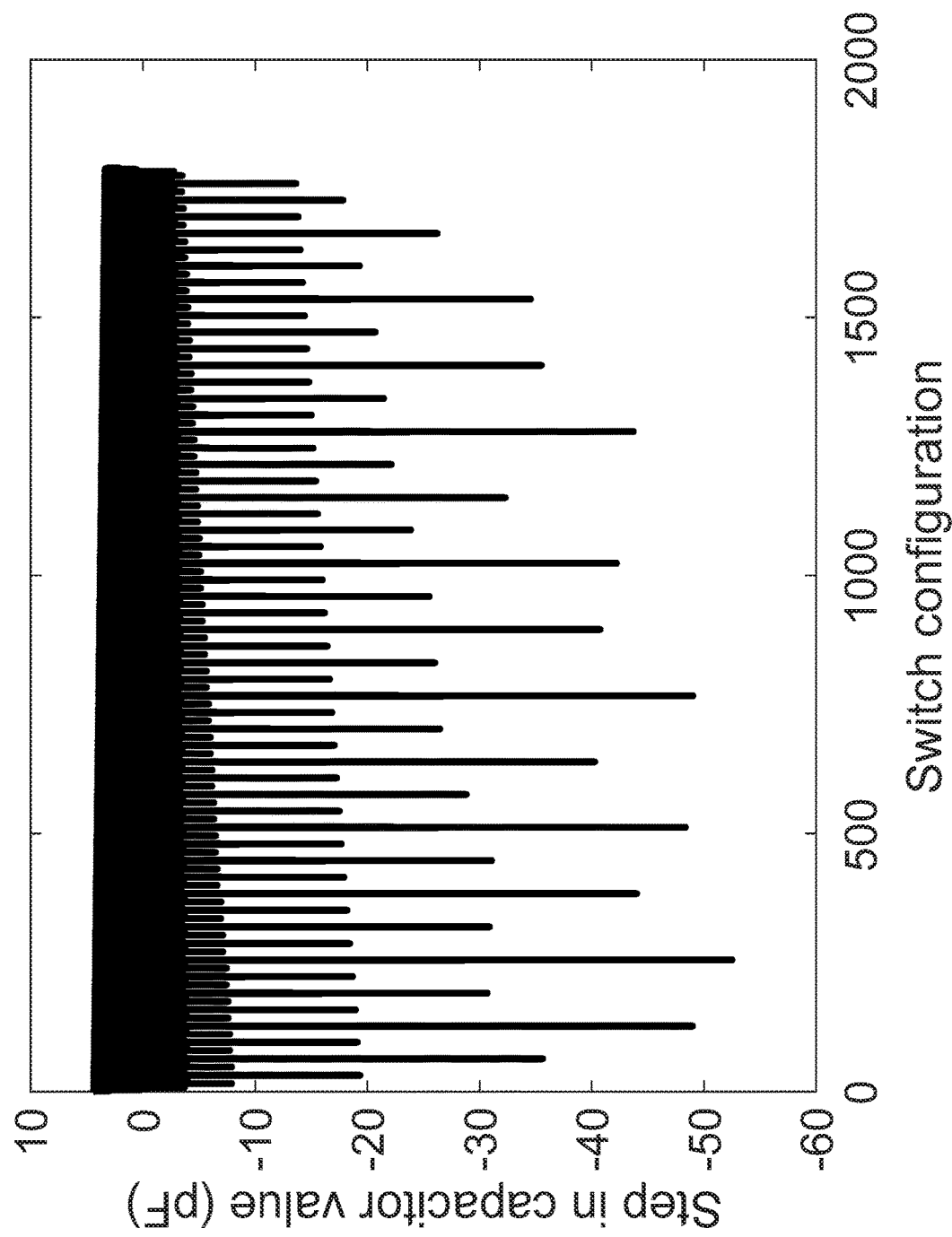
FIG. 14 illustrates the change in analog output when a switch configuration is incremented by one and the values of the individual contributors are calculated in accordance with the method of FIG. 11.

FIG. 13 shows an example of total capacitance (C in FIG. 3B) as a function of switch configuration for a variable capacitor using switched capacitors with the capacitor values calculated in accordance with the procedure of FIG. 11. FIG. 14 shows the step in capacitor value when the switch configuration is incremented by one as a function of the switch configuration. FIG. 14 is confirmation that the procedure of FIG. 11 ensures that the step on capacitor value never exceeds the desired maximum step size, dC, (i.e., none of the illustrated steps is greater than 5 pF).

Figure 15:
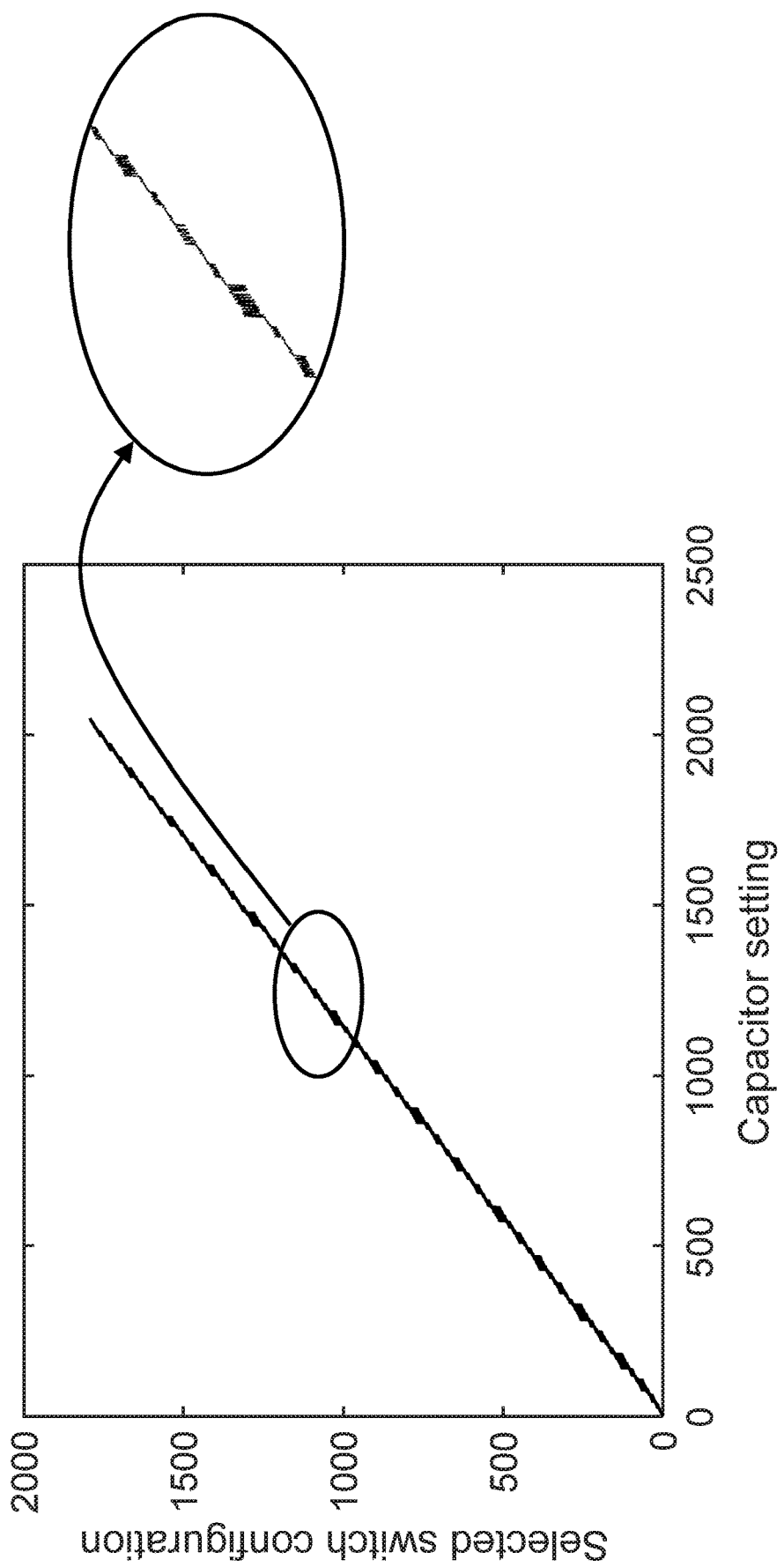
FIG. 15 illustrates a mapping between a digital input and a switch configuration.

Given calculated contributions for the fractional and full-valued capacitors, it may be desirable to have a linear or monotonic relationship between capacitor setting, which may be a digital input applied to the variable capacitor, and the resulting capacitance of the variable capacitor. FIG. 13 shows the relationship between variable capacitor capacitance and switch configuration for a variable capacitor with switched capacitor values chosen using the method 1100. Thus, an additional step to methods 1100 and 1200 may include determining a mapping between capacitor setting and switch configuration. This process is carried out for the physically constructed variable capacitor incorporating capacitors with values chosen as described above to ensure that the maximum step is smaller than a desired step size. Because of the way in which the capacitor values are calculated, one is assured that if all switch configurations are used, one can find a sequence of switch configurations mapped to the capacitor setting such that a capacitor setting from 0 to 1 (or 0 to 2047 or another preferred mapping) corresponds to the actual variable capacitor capacitance going from a minimum to a maximum value in a monotonically increasing fashion, and that there are no steps larger than the desired step size, dC. FIG. 15 is an example of such a mapping between capacitor setting on the horizontal axis and switch configuration on the vertical axis. The vertical axis is the switch configuration that results in a capacitor value that most closely matches the capacitor value that should correspond to the capacitor setting on the horizontal axis. The process involves measuring the capacitance for all switch configurations with e.g., a network analyzer, removing nominal parasitic elements to arrive at a model such as FIG. 3B, and then selecting those switch configurations that are closest to each of the discretized capacitor settings. The discretization of the capacitor setting should be done in such a way that it does not contribute significantly to the step size. For instance, if the physical capacitor varies from 50 to 285 pF and the desired maximum step size is 5 pF, one may choose to use 0 to 1023 for the discretization. This results in an additional error of (285−50)/1024=0.23 pF. If the physical capacitor used a sub-binary sequence consisting of nominal contributions of 4 fractional bits and 5 full valued bits (e.g., 4, 7, 12.5, 22 pF fractional bits and 5 full valued bits of 40 pF), the total possible number of combinations is two to the ninth power or 512. This means that for some capacitor settings the switch configuration should be repeated if more than 512 switch settings, e.g. 2048, are used (e.g., capacitor settings of 500, 501, and 502 may all use the same switch configuration and thus correspond to the same capacitor value). In a traditional digital to analog conversion scheme, one would use (285−50)/5=47 steps rounded up to the next power of two, so typically 64 steps rather than 1023 steps. One can of course use the same re-mapping technique for capacitors not chosen according to the sub-binary scheme, but doing so does not guarantee a maximum step size.

A switch configuration is a specific and unique combination of on and off states of contributors, where switch configurations are mapped to an interval of numbers in such a way that one endpoint of the interval corresponds to the minimum analog output from the digital to analog converter and the other endpoint of the interval corresponds to the maximum analog output from the digital to analog converter, the analog output of the digital to analog converter is monotonic over the interval and it is possible to make a small enough step in the interval so that the absolute value of the corresponding step in analog output from the digital to analog converter is less than D.

Figure 16:
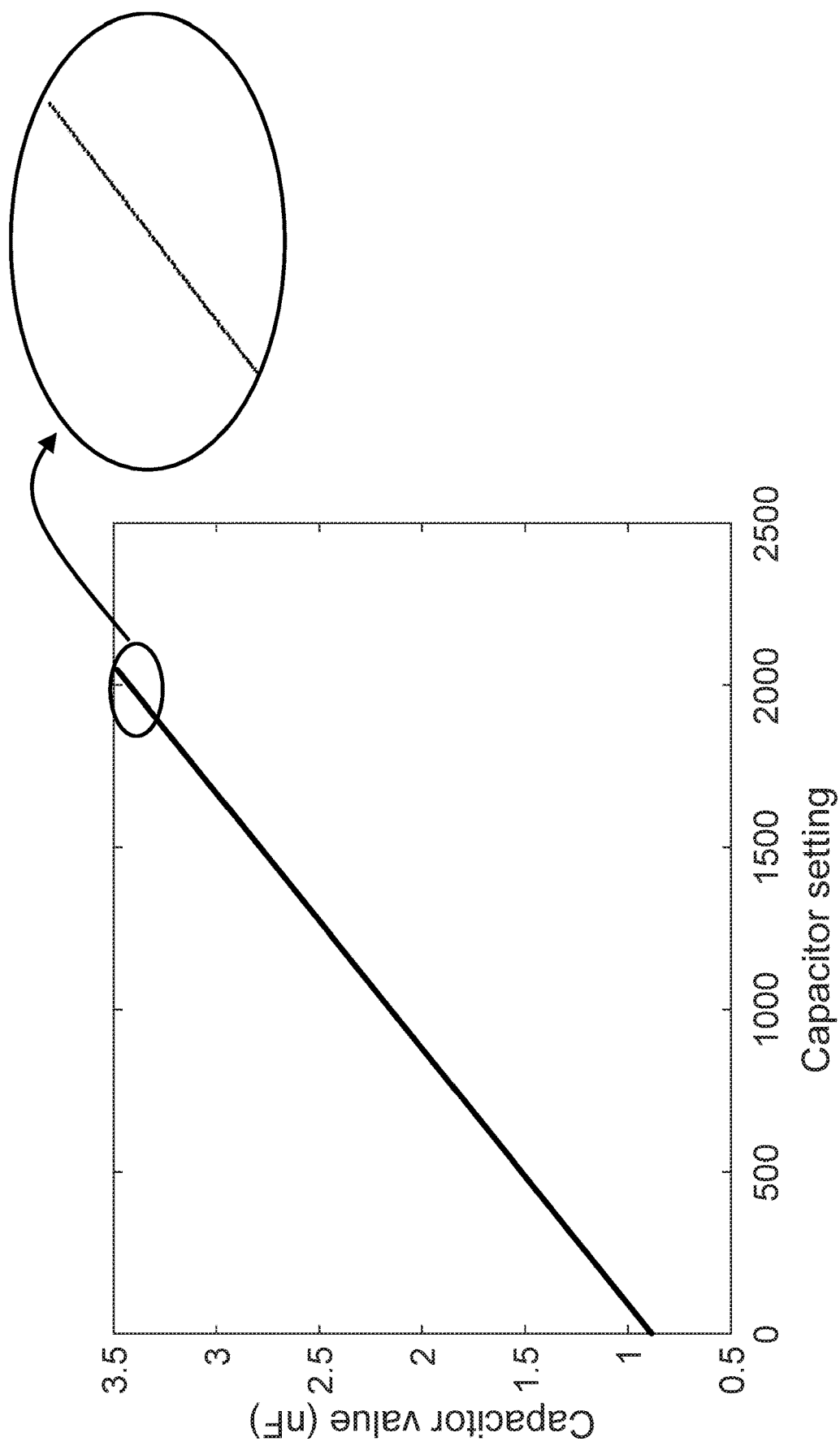
FIG. 16 illustrates an analog output as a function of a digital input when the mapping of FIG. 15 is applied between a switch configuration and the digital input and the values of the individual contributors are calculated in accordance with the method of FIG. 11.

FIG. 16 shows the correspondence between capacitor setting and variable capacitor capacitance using the mapping between switch configuration and capacitor setting illustrated in FIG. 15 and described above.

Figure 17:
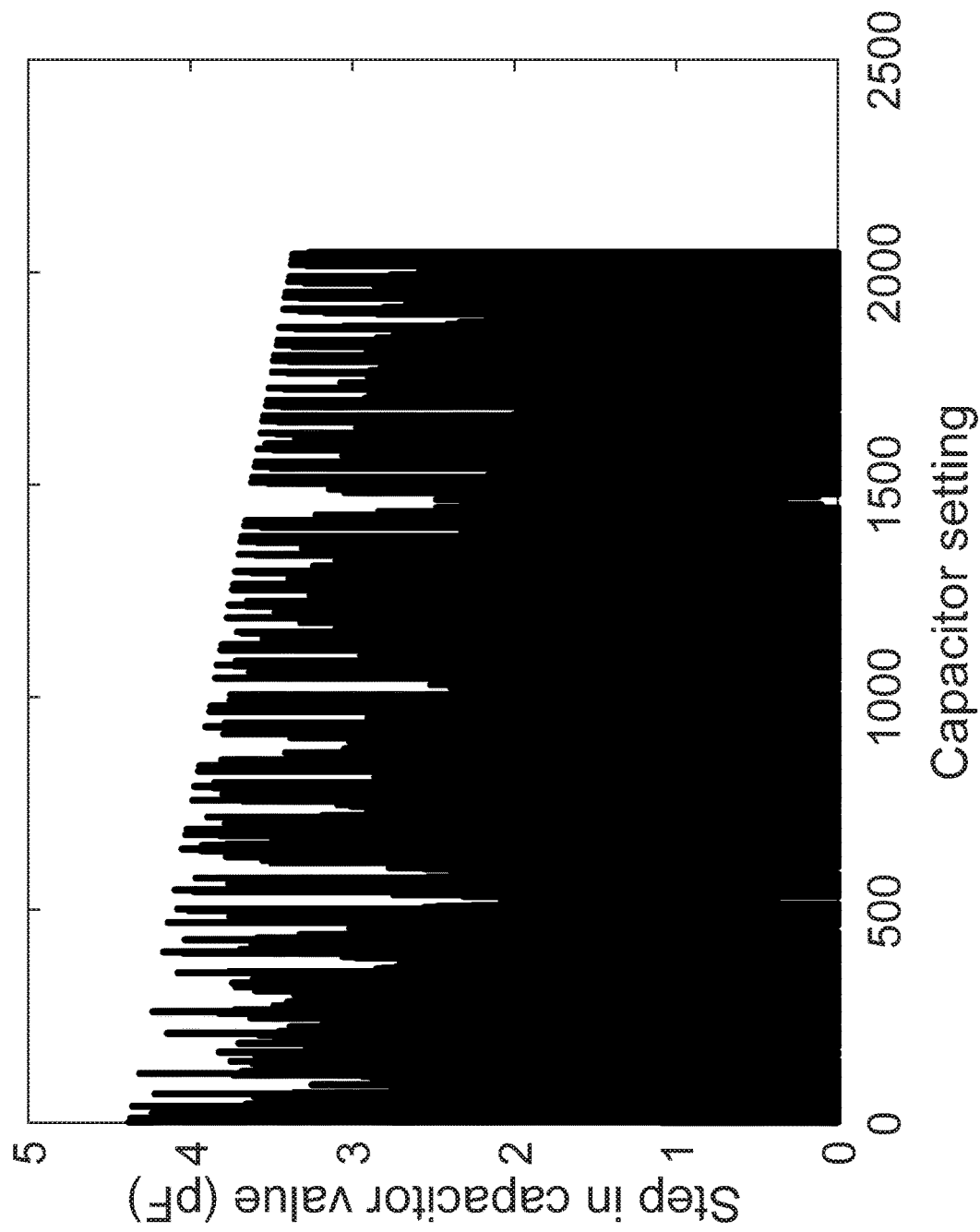
FIG. 17 illustrates the change in analog output when a digital input is incremented by one and the mapping of FIG. 15 is applied between a switch configuration and the digital input and the values of the individual contributors are calculated in accordance with the method of FIG. 11.

FIG. 17 illustrates the change in variable capacitor capacitance when the capacitor setting is incremented by one and the mapping of FIG. 15 is applied between a switch configuration and the capacitor setting and the values of the switched capacitor are calculated in accordance with the method of FIG. 11.

The following example highlights the effectiveness of the disclosed solution. Consider two successive binary numbers 10110111 and 10111000 specifying two capacitor switch configurations. The least significant bit (LSB) on the right in each binary number specifies whether or not the first capacitor contribution is added to the total (1 means add, 0 don't add), the second number from the right specifies whether the second capacitor contribution is added to the total, and so on. To increment the binary number one can proceed from the LSB and find the first 0, change that 0 to a 1 and change everything to the right to zero. All the bits to the left of the 0 that changed to a 1 are unchanged. Even though these bits do not change, the effective capacitance that they add to the total can change as shown in FIGS. 6-10. However, the contribution of these unchanged bits do not change much for a small change in capacitor value and the change can be bounded as dCu. The change coming from the change in which fractional values were added is no bigger than the maximum contribution of the fourth bit minus the sum of the minimum contributions of the first through third bits. However, the procedure of FIG. 11 ensures that the maximum contribution of the fourth bit is less than the sum of the minimum contributions of lower bits plus the desired step size, so the total change is less than dCu+the desired step size. The total capacitance can thus go from a base value to the base value plus the sum of the minimum contributions of all the capacitors, and successive capacitor settings increase by no more than dCu+the desired step size. Hence, the capacitor range from the base value to the base value plus the sum of the minimum contributions of all the capacitors can be covered with steps no larger than dCu+the desired step size. In most practical applications dCu is negative as is shown in FIGS. 6-10 with individual capacitor contributions decreasing as capacitor setting is increasing. If dCu is positive but less than the desired step size, it can be taken into account by reducing dC by dCu in the procedure of FIG. 11.

The technique described here to create a variable capacitor that has a monotonic relationship between capacitor setting and variable capacitor capacitance in the presence of variable contributions by the switched capacitor can be applied more generally. For example, in a digital to analog converter that sums together individual current sources to produce a total current output, the same techniques can be applied to the digital to analog converter if the contributions of the individual current sources do not contribute the same amount to the output current as the total output current is varied. We can describe the combination of a capacitor and switch or the individual current sources more broadly as contributors that contribute to a combined analog output. In the case of the variable capacitor the analog output is the capacitance presented to the terminals of the output and in the case of the current source the analog output is the total current output from the analog output of the current source.

Figure 18B:
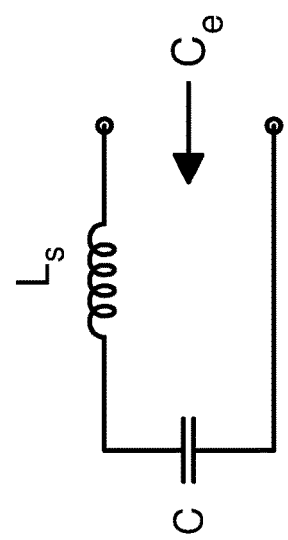
FIGS. 18A and 18B illustrate an embodiment of a digital-to-analog (DAC) and an equivalent circuit thereof.
Figure 18A:
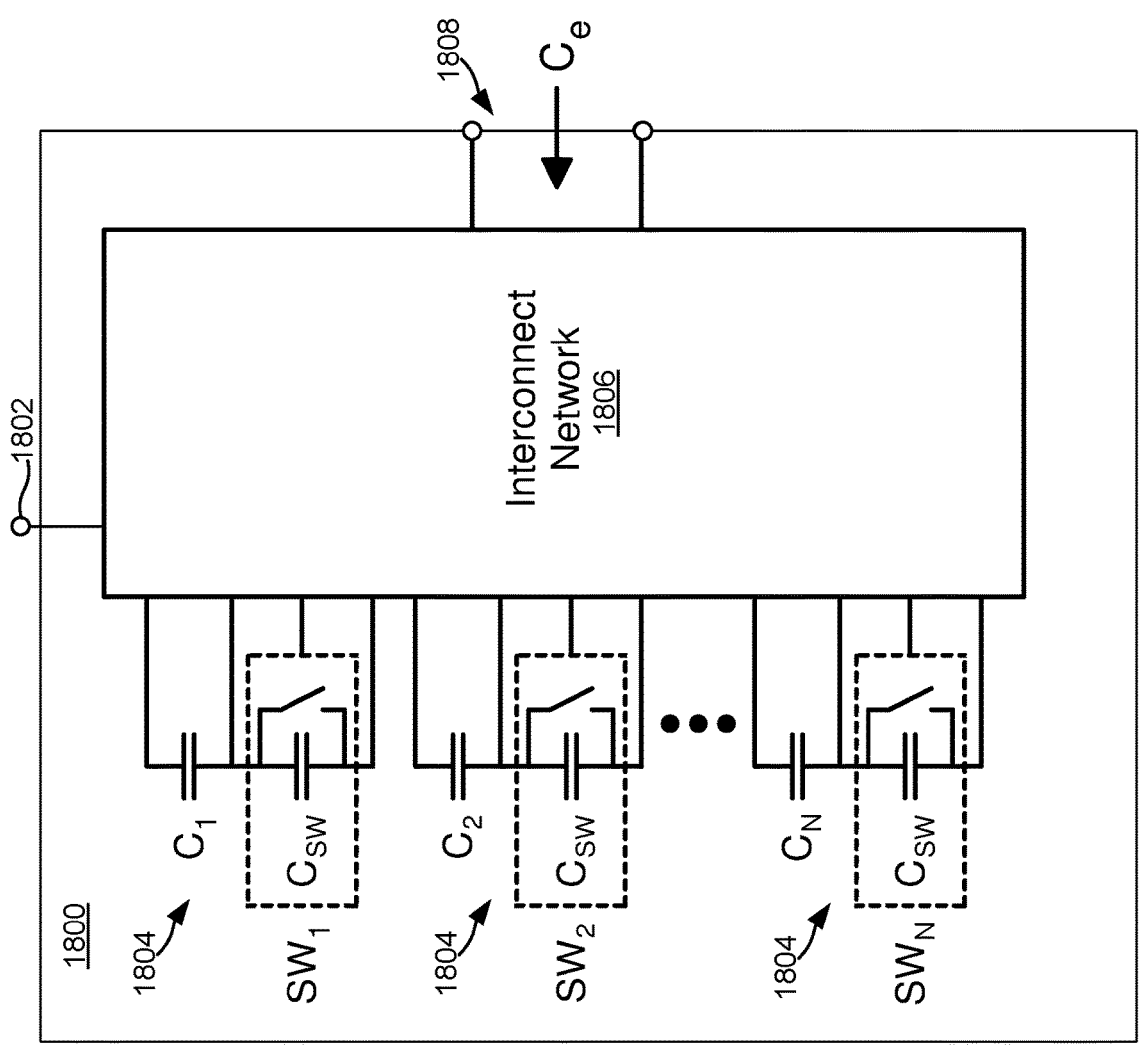

FIG. 18A illustrates a digital to analog converter (DAC) and an equivalent circuit (FIG. 18B). The DAC 1800 can include a digital input 1802, N contributors 1804, an interconnect network 1806, and an analog output 1808. The N contributors 1804 can each have an on and an off state that is controlled by the digital input 1802. The interconnect network 1806 can be coupled to each of the N contributors 1804 as well as the analog output 1808. The interconnect network 1806 can be configured to provide a sum of contributions of the N contributors 1804 to the analog output 1808. For each of the N contributors 1804, a contribution of the one of the N contributors 1804 is a change in the analog output when the state of the one of the N contributors is changed from off to on and all remaining N−1 contributors' 1804 states remain the same. For instance, FIGS. 6-10 show plots of data derived from turning a contributor's 1804 state on and off while all other contributors' 1804 states remained the same. This process provides a simulated maximum and minimum contribution for each contributor 1804. In other words, the contribution of each contributor varies as the analog output is varied. A ratio of the maximum to the minimum contribution for at least one of the contributors 1804 is at least 1:1. An average contribution of each of the N contributors 1804 can be found and the N contributors 1804 can be ordered from smallest to largest average contribution to form an ordering. The average can be determined, in one instance, as the square root of a product of a maximum and a minimum contribution of the one of the N contributors 1804. A gap size, D, can be less than or equal to two times a maximum of a contribution of a first of the N contributors 1804. A maximum contribution of each of the N contributors 1804 can then be defined for the $k^{th}$ contributor, where k is two through N. A maximum contribution of the $k^{th}$ contributor is less than or equal to D plus a sum of minimum contributions of contributor 1 (i.e., k=1) through contributor k−1. In equation form:

$$C\max(k) \leq (\Sigma_{k=2}^{n} C\min(k)) + D \qquad \text{Equation (3)}$$

The DAC 1800 can use fractional and full-valued contributors, in the same way that fractional and full-valued capacitors were described earlier. In one embodiment, four or more fractional contributors are used, a first ratio of an average contribution of contributor four in the ordering of the N contributors over an average contribution of contributor three in the ordering of the N contributors is at least 1.2, and a second ratio of the average contribution of contributor four in the ordering of the N contributors over an average contribution of the first contributor in the ordering of the N contributors is less than 6. In another embodiment, there are five or more fractional contributors, a third ratio of an average contribution of contributor five in the ordering of the N contributors over an average contribution of contributor four in the ordering of the N contributors is at least 1.2, and a fourth ratio of an average contribution of contributor five in the ordering of the N contributors over an average contribution of the first contributor in the ordering of the N contributors is less than 12. In another embodiment, there are six or more fractional contributors, a fifth ratio of an average contribution of contributor six in the ordering of the N contributors over an average contribution of contributor five in the ordering of the N contributors is at least 1.2, and a sixth ratio of the average contribution of contributor six in the ordering of the N contributors over an average contribution of the first contributor in the ordering of the N contributors is less than 20.

For a practical and efficient control scheme, there should be a monotonic relationship between contributor settings (i.e., the digital input 1802 settings) and the analog output 1808. Accordingly, the analog output 1808 can have a monotonic relationship to the digital input 1802 and a largest gap size in the analog output 1808 per increment of the digital input 1802, is less than D.

The DAC 1804 can take various forms. For instance, the DAC 1804 could be a variable capacitor for use, for instance, in a matching network (e.g., for plasma processing). The contributors 1808 could be capacitors that are each in series with a respective switch to thereby switch the capacitors in and out of the variable capacitor. In an embodiment, the switches can be PIN diodes.

Although the term gap size is used relative to both variables dC and D, these are not necessarily the same gap size. The gap size dC refers to a gap size selected during testing and design of a variable capacitor. Gap size D refers to a gap size that is based on an existing system, for instance, where one seeks to determine whether a DAC or variable capacitor is using a sub-binary or binary sequence of fractional contributors.

Figure 19:
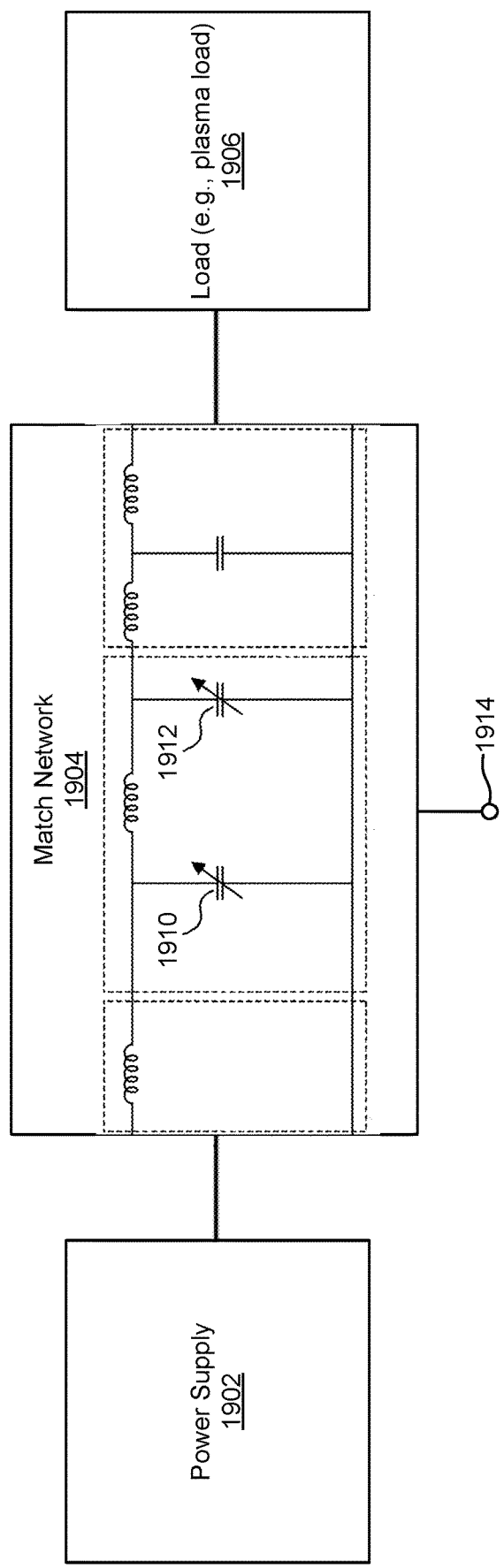
FIG. 19 illustrates a power system including a power supply, a match network, and a load.

FIG. 19 illustrates a power system comprising a match network 1904, which could utilize embodiments of the DAC shown and described relative to FIG. 18. The power system 1900 can include a power supply 1902 coupled to and providing power to a load 1906 through the match network 1904. The match network 1904 can include one or more variable capacitors 1910, 1912, each of which can include N switched capacitors, an interconnect topology, and an analog output of the interconnect topology, and a digital input (all as shown in FIG. 18). The match network 1904 can include a digital input 1914 that can be coupled to or control the digital inputs of each of the one or more variable capacitors 1910, 1912. The load 1906 can include, for instance, a plasma load such as seen within a plasma processing chamber or a remote plasma source, where a remote plasma is remotely generated and then fed into a processing chamber.

Figure 20:
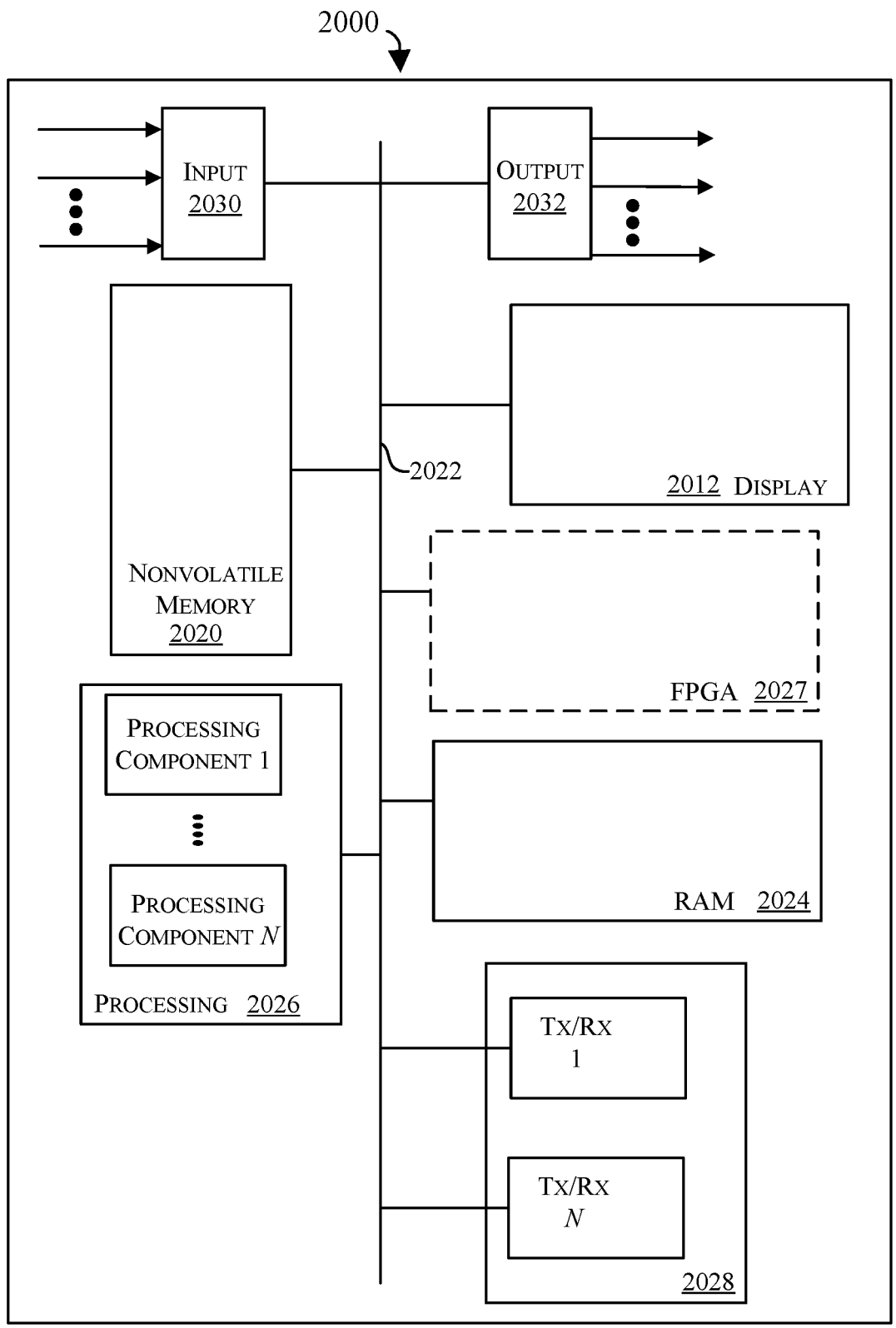
FIG. 20 illustrates a block diagram depicting physical components that may be utilized to realize a controller of the interconnect network in FIG. 3A, the DAC, or the match network, according to an exemplary embodiment.

The methods described in connection with the embodiments disclosed herein may be embodied directly in hardware, in processor-executable code encoded in a non-transitory tangible processor readable storage medium, or in a combination of the two. Referring to FIG. 20 for example, shown is a block diagram depicting physical components that may be utilized to realize a controller of the interconnect network in FIG. 3A, the DAC 1800, or the match network 1904, according to an exemplary embodiment. As shown, in this embodiment a display portion 2012 and nonvolatile memory 2020 are coupled to a bus 2022 that is also coupled to random access memory ("RAM") 2024, a processing portion (which includes N processing components) 2026, an optional field programmable gate array (FPGA) 2027, and a transceiver component 2028 that includes N transceivers. Although the components depicted in FIG. 20 represent physical components, FIG. 20 is not intended to be a detailed hardware diagram; thus many of the components depicted in FIG. 20 may be realized by common constructs or distributed among additional physical components. Moreover, it is contemplated that other existing and yet-to-be developed physical components and architectures may be utilized to implement the functional components described with reference to FIG. 20.

This display portion 2012 generally operates to provide a user interface for a user, and in several implementations, the display is realized by a touchscreen display. In general, the nonvolatile memory 2020 is non-transitory memory that functions to store (e.g., persistently store) data and processor-executable code (including executable code that is associated with effectuating the methods described herein). In some embodiments for example, the nonvolatile memory 2020 includes bootloader code, operating system code, file system code, and non-transitory processor-executable code to facilitate the execution of a method described with reference to FIGS. 11 and 12 described further herein.

In many implementations, the nonvolatile memory 2020 is realized by flash memory (e.g., NAND or ONENAND memory), but it is contemplated that other memory types may be utilized as well. Although it may be possible to execute the code from the nonvolatile memory 2020, the executable code in the nonvolatile memory is typically loaded into RAM 2024 and executed by one or more of the N processing components in the processing portion 2026.

The N processing components in connection with RAM 2024 generally operate to execute the instructions stored in nonvolatile memory 2020 to enable control of the interconnect network in FIG. 3A, the DAC 1800, or the match network 1904, or for selection of sub-binary sequence of capacitors. For example, non-transitory, processor-executable code to effectuate the methods described with reference to FIGS. 11 and 12 may be persistently stored in nonvolatile memory 2020 and executed by the N processing components in connection with RAM 2024. As one of ordinarily skill in the art will appreciate, the processing portion 2026 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 2026 may be configured to effectuate one or more aspects of the methodologies described herein (e.g., the methods described with reference to FIGS. 11 and 12). For example, non-transitory processor-readable instructions may be stored in the nonvolatile memory 2020 or in RAM 2024 and when executed on the processing portion 2026, cause the processing portion 2026 to perform control of the interconnect network in FIG. 3A, the DAC 1800, or the match network 1904, or for selection of sub-binary sequence of capacitors. Alternatively, non-transitory FPGA-configuration-instructions may be persistently stored in nonvolatile memory 2020 and accessed by the processing portion 2026 (e.g., during boot up) to configure the hardware-configurable portions of the processing portion 2026 to effectuate the functions of a control of the interconnect network in FIG. 3A, the DAC 1800, or the match network 1904.

The input component 2030 operates to receive signals (e.g., user inputs in the case of a controller, or the digital input in the case of an interconnect topology) that are indicative of one or more aspects of a user control on a DAC or match network, or for selection of sub-binary sequence of capacitors. The output component generally operates to provide one or more analog or digital signals to effectuate an operational aspect of the controller. For example, the output portion 2032 may provide the analog output.

The depicted transceiver component 2028 includes N transceiver chains, which may be used for communicating with external devices via wireless or wireline networks. Each of the N transceiver chains may represent a transceiver associated with a particular communication scheme (e.g., WIFI, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A digital to analog converter comprising:
   a digital input;
   N contributors each having an on and an off state that is controlled by the digital input;
   an interconnect network coupled to each of the N contributors and an analog output, wherein the interconnect network is configured to provide a sum of contributions of the N contributors to the analog output, wherein
   for each of the N contributors:
   a contribution of one of the N contributors is a change in the analog output when the state of the one of the N contributors is changed from off to on and all remaining N−1 contributors' states remain the same;
   the contribution of at least one of the N contributors varies as the analog output is varied and a ratio of a maximum to a minimum of the contribution of the at least one of the N contributors is at least 1.1;
   wherein the N contributors are ordered from smallest to largest average contribution to form an ordering,
   wherein a gap size, D, is less than or equal to two times a maximum of a contribution of a first of the N contributors, and
   for k ranging from two to N, a maximum contribution of a $k^{th}$ contributor is less than or equal to D plus a sum of minimum contributions of contributor 1 through contributor k−1.

2. The digital to analog converter of claim 1, wherein the average contribution of the at least one of the N contributors is a square root of a product of a maximum and a minimum contribution of the at least one of the N contributor.

3. The digital to analog converter of claim 1, wherein:
   there are four or more fractional contributors;
   a first ratio of an average contribution of contributor four in the ordering of the N contributors over an average contribution of contributor three in the ordering of the N contributors is at least 1.2; and
   a second ratio of the average contribution of contributor four in the ordering of the N contributors over an average contribution of the first contributor in the ordering of the N contributors is less than 6.

4. The digital to analog converter of claim 1, wherein:
   there are five or more fractional contributors;
   a third ratio of an average contribution of contributor five in the ordering of the N contributors over an average contribution of contributor four in the ordering of the N contributors is at least 1.2; and
   a fourth ratio of an average contribution of contributor five in the ordering of the N contributors over an average contribution of the first contributor in the ordering of the N contributors is less than 12.

5. The digital to analog converter of claim 1, wherein:
   there are six or more fractional contributors;
   a fifth ratio of an average contribution of contributor six in the ordering of the N contributors over an average contribution of contributor five in the ordering of the N contributors is at least 1.2; and
   a sixth ratio of the average contribution of contributor six in the ordering of the N contributors over an average contribution of the first contributor in the ordering of the N contributors is less than 20.

6. The digital to analog converter of claim 1, wherein the analog output has a monotonic relationship to the digital input and a largest gap size in the analog output per increment of the digital input, is less than D.

7. The digital to analog converter of claim 1, in which the analog output value is the capacitance of a variable capacitor.

8. The digital to analog converter of claim 7, in which the contributors are capacitors in series with switches.

9. The digital to analog converter of claim 8, in which the switches are PIN diodes.

10. A match network comprising one or more variable capacitors, each of the one or more variable capacitors comprising:
    a digital input;

N switched capacitors each having an on and an off state that is controlled by the digital input and an output;

an interconnect network coupled to each of the N switched capacitors, wherein the interconnect network is configured to provide a sum of the contributions of the N switched capacitors to a capacitance of the variable capacitor between terminals of the output;

wherein for each one of the N switched capacitors:
a contribution of one of the N switched capacitors is a change in the variable capacitor capacitance when a state of the one of the switched capacitors is switched from off to on and all remaining N−1 switched capacitors' states remain the same, and
the contribution of at least one of the switched capacitors varies across a range based on the states of the remaining N−1 switched capacitors;

wherein the N switched capacitors are ordered from smallest to largest via an average of each switched capacitors' range of contributions to the variable capacitor capacitance, wherein a gap size, D, is less than or equal to two times a maximum of a contribution of a first of the N switched capacitors, and for k ranging from two to N, a maximum contribution of a $k^{th}$ switched capacitor is less than or equal to D plus a sum of minimum contributions of switched capacitor 1 through switched capacitor k−1.

11. The match network of claim 10, wherein the range of the contribution of the at least one of the switched capacitors is such that the ratio of the maximum contribution of the at least one of the switched capacitors to the minimum contribution of the at least one of the switched capacitors is at least 1.1.

12. The match network of claim 10, wherein:
a first ratio of an average contribution of a fourth one of the N switched capacitors over an average contribution of a third one of the N switched capacitors is at least 1.2; and
a second ratio of the average contribution of the fourth of the N switched capacitors over an average contribution of the first of the N switched capacitors is less than 6.

13. The match network of claim 10, wherein:
a third ratio of an average contribution of a fifth of the N switched capacitors over an average contribution of a fourth of the N switched capacitors is at least 1.2; and
a fourth ratio of an average contribution of the fifth of the N switched capacitors over an average contribution of the first of the N switched capacitors is less than 12.

14. The match network of claim 10, wherein:
a fifth ratio of an average contribution of a sixth of the N switched capacitors over an average contribution of a fifth of the N switched capacitors is at least 1.2; and
a sixth ratio of the average contribution of the sixth of the N switched capacitors over an average contribution of the first of the N switched capacitors is less than 20.

15. The match network of claim 10, wherein the variable capacitor capacitance has a monotonic relationship to the digital input and a largest gap size in the variable capacitor capacitance per increment of the digital input, is less than D.

16. A method of forming a variable capacitor, the method comprising:
providing a digital input;
providing N switched capacitors coupled to each other via an interconnect topology;
providing an analog output, from the interconnect topology as a sum of capacitance contributions of the N switched capacitors; and
selecting the N capacitors to form a sub-binary sequence, where a maximum contribution of a $k^{th}$ switched capacitor is less than or equal to a gap size, D, plus a sum of minimum contributions of a first to a $(k-1)^{th}$ switched capacitor.

17. The method of claim 16, wherein the gap size, D, is less than or equal to two times a maximum contribution of a first of the N switched capacitors.

18. The method of claim 16, wherein each of the N switched capacitors has a range of contributions to the sum of capacitance contributions and for at least one of the N switched capacitors this range is such that a ratio of a maximum to a minimum contribution of the at least one of the N switched capacitors is at least 1.1.

* * * * *